(12) United States Patent
Sone et al.

(10) Patent No.: US 10,505,046 B2
(45) Date of Patent: Dec. 10, 2019

(54) FIELD-EFFECT TRANSISTOR INCLUDING A METAL OXIDE COMPOSITE PROTECTIVE LAYER, AND DISPLAY ELEMENT, IMAGE DISPLAY DEVICE, AND SYSTEM INCLUDING THE FIELD-EFFECT TRANSISTOR

(71) Applicant: RICOH COMPANY, LTD., Tokyo (JP)

(72) Inventors: Yuji Sone, Kanagawa (JP); Naoyuki Ueda, Kanagawa (JP); Yuki Nakamura, Tokyo (JP); Mikiko Takada, Kanagawa (JP); Shinji Matsumoto, Kanagawa (JP); Ryoichi Saotome, Kanagawa (JP); Sadanori Arae, Kanagawa (JP); Yukiko Abe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 64 days.

(21) Appl. No.: 14/440,969

(22) PCT Filed: Nov. 27, 2013

(86) PCT No.: PCT/JP2013/082512
§ 371 (c)(1),
(2) Date: May 6, 2015

(87) PCT Pub. No.: WO2014/084406
PCT Pub. Date: Jun. 5, 2014

(65) Prior Publication Data
US 2015/0349138 A1    Dec. 3, 2015

(30) Foreign Application Priority Data

Nov. 30, 2012  (JP) .................................. 2012-262079

(51) Int. Cl.
*H01L 29/786* (2006.01)
*H01L 27/12* (2006.01)
(Continued)

(52) U.S. Cl.
CPC ......... *H01L 29/78606* (2013.01); *G09G 3/30* (2013.01); *G09G 3/344* (2013.01);
(Continued)

(58) Field of Classification Search
CPC .................................................. H01L 29/78606
See application file for complete search history.

(56) References Cited

U.S. PATENT DOCUMENTS

2007/0194312 A1* 8/2007 Chuman ............. G02F 1/13454
257/59
2008/0197350 A1   8/2008 Park et al.
(Continued)

FOREIGN PATENT DOCUMENTS

CN   102598283 A   7/2012
JP   59-150430      8/1984
(Continued)

OTHER PUBLICATIONS

Dec. 8, 2015 Taiwanese official action (and English translation thereof) in corresponding Taiwanese Patent Application No. 102143100.
(Continued)

*Primary Examiner* — Mohsen Ahmadi
*Assistant Examiner* — Christopher M Roland
(74) *Attorney, Agent, or Firm* — Oblon, McClelland, Maier & Neustadt, L.L.P.

(57) ABSTRACT

To provide a field-effect transistor, containing: a substrate; a protective layer; a gate insulating layer formed between the substrate and the protective layer; a source electrode and a drain electrode, which are formed to be in contact with the gate insulating layer; a semiconductor layer, which is
(Continued)

formed at least between the source electrode and the drain electrode, and is in contact with the gate insulating layer, the source electrode, and the drain electrode; and a gate electrode, which is formed at an opposite side to the side where the semiconductor layer is provided, with the gate insulating layer being between the gate electrode and the semiconductor layer, and is in contact with the gate insulating layer, wherein the protective layer contains a metal oxide composite, which contains at least Si and alkaline earth metal.

11 Claims, 11 Drawing Sheets

(51) Int. Cl.
  *G09G 3/34*   (2006.01)
  *G09G 3/30*   (2006.01)
  *G09G 3/36*   (2006.01)
  *G09G 3/38*   (2006.01)
(52) U.S. Cl.
  CPC ........... *G09G 3/348* (2013.01); *G09G 3/3696* (2013.01); *G09G 3/38* (2013.01); *H01L 27/124* (2013.01); *H01L 27/1225* (2013.01); *H01L 27/1244* (2013.01); *H01L 27/1248* (2013.01); *H01L 29/7869* (2013.01); *G09G 2300/0426* (2013.01)

(56) References Cited

U.S. PATENT DOCUMENTS

| | | | |
|---|---|---|---|
| 2008/0277663 A1* | 11/2008 | Kang | H01L 29/78606 257/57 |
| 2010/0133591 A1 | 6/2010 | Fix et al. | |
| 2010/0193772 A1 | 8/2010 | Morosawa et al. | |
| 2010/0203673 A1* | 8/2010 | Hayashi | H01L 29/78618 438/104 |
| 2010/0252906 A1* | 10/2010 | Tomiyasu | G02F 1/13454 257/506 |
| 2010/0276688 A1 | 11/2010 | Yano et al. | |
| 2011/0014745 A1* | 1/2011 | Miyanaga | H01L 27/1225 438/104 |
| 2011/0057188 A1 | 3/2011 | Yamazaki et al. | |
| 2011/0108863 A1 | 5/2011 | Yamazaki et al. | |
| 2011/0240988 A1* | 10/2011 | Yano | H01L 29/78609 257/43 |
| 2013/0202921 A1 | 8/2013 | Rizzi et al. | |
| 2014/0009514 A1 | 1/2014 | Abe et al. | |
| 2016/0267873 A1* | 9/2016 | Saotome | H01L 29/7869 |

FOREIGN PATENT DOCUMENTS

| | | |
|---|---|---|
| JP | 2007-299913 | 11/2007 |
| JP | 2008-205469 | 9/2008 |
| JP | 2009230953 A * | 10/2009 |
| JP | 2010-103203 | 5/2010 |
| JP | 2010-122217 | 6/2010 |
| JP | 2010-182819 | 8/2010 |
| JP | 2011-077515 | 4/2011 |
| JP | 2011-216845 | 10/2011 |
| JP | 2011-222788 | 11/2011 |
| JP | 2012-199317 | 10/2012 |
| JP | 2012-216780 | 11/2012 |
| KR | 10-2007-0046614 | 5/2017 |
| TW | 200943552 A1 | 10/2009 |
| TW | 201235295 A1 | 9/2012 |
| WO | WO2009/081885 A1 | 7/2009 |

OTHER PUBLICATIONS

Jun. 7, 2016 Japanese official action in corresponding Japanese Patent Application.
Nov. 22, 2016 Chinese official action (including English translation thereof) in corresponding Chinese Patent Application No. 201380062543.X.
Apr. 17, 2015 Taiwanese official action in corresponding Taiwanese Patent Application No. 102143100.
International Search Report dated Jan. 21, 2014 for counterpart International Patent Application No. PCT/JP2013/082512 filed Nov. 27, 2013.
K. Nomura, and five others, Room-temperature fabrication of transparent flexible thin-film transistors using amorphous oxide semiconductors, Nature, vol. 432, No. 25, Nov. 2004, pp. 488-492.
European search report dated Oct. 23, 2015 in corresponding European Patent Application No. 13859244.9.
Korean official action dated Apr. 11, 2017 in connection with corresponding Korean patent application No. 10-2015-7014856.
European Patent Office Communication dated Aug. 21, 2017 in connection with corresponding European patent application No. 13859244.9.

* cited by examiner

Light

FIELD-EFFECT TRANSISTOR INCLUDING A METAL OXIDE COMPOSITE PROTECTIVE LAYER, AND DISPLAY ELEMENT, IMAGE DISPLAY DEVICE, AND SYSTEM INCLUDING THE FIELD-EFFECT TRANSISTOR

TECHNICAL FIELD

The present invention relates to a field-effect transistor, a display element, an image display device, and a system.

BACKGROUND ART

A field-effect transistor (FET), which is a type of semiconductor devices, is a transistor configured to apply gate voltage to excite a carrier in a semiconductor in a state that an electric field is applied to a channel so that electric current passed through between a source and a drain can be controlled.

Since the FET is capable of switching by applying gate electrode, the FET is used as various switching elements, or amplifier elements. As the FET has a flat structure as well as using low gate electric current, the FET can be easily produced compared to a bipolar transistor. Moreover, high integration of the FET can be also easily carried out. For these reasons, the FET has been used in many of integrated circuits of current electric devices.

Among them, the FET is applied as a thin film transistor (TFT) in an active-matrix display.

As for an active-matrix flat panel display (FPD), a liquid crystal display (LCD), an organic electroluminescence (EL) display (OLED), and electronic paper have been recently realized.

These FPDs are typically driven by a driving circuit containing a TFT, in which amorphous silicon or polycrystalline silicon is used in an active layer. There are demands for the FPD to be increased in the size, definition, and driving speed thereof. Along with these demands, there is a need for TFTs, which have high carrier mobility, small aging variations in the properties, and small variations between the elements.

Currently, in addition to silicon, an oxide semiconductor has been attracted attentions as a semiconductor of the active layer. Among them, $InGaZnO_4$ (a-IGZO) has characteristics that film formation thereof can be carried out at room temperature, it is amorphous, and it has high mobility of around 10 $cm^2/V \cdot s$.

Therefore, developments thereof for practical use have been actively conducted (see, for example, NPL 1).

The FET typically contains a protective layer for the purpose of protecting a semiconductor layer serving as the active layer. Various researches have been also conducted on the protective layer.

For example, a $SiO_2$ layer (see, for example, PTL 1, and PTL 2), a SiNx layer (see, for example, PTL 1), a SiON layer (see, for example, PTL 3), and an $Al_2O_3$ layer (see, for example, PTL 4) are disclosed as a protective layer of the FET. Moreover, a composite oxide layer, in which $SiO_2$ forms a composite with Al or B, is disclosed as a protective layer of the FET (see, for example, PTL 5).

When the $SiO_2$ layer, and the composite oxide layer are formed on the silicon semiconductor layer, oxide semiconductor layer, metal lines, and oxide lines, there are however a problem that a crack or pealing is formed in a heating process of a post processing. Moreover, the SiON layer, SiNx layer, and $Al_2O_3$ layer have a problem that signal delay is caused due to parasitic capacitance.

Moreover, use of an organic material in the protective layer has been disclosed.

For example, a polyimide resin layer (see, for example, PTL 6), and a fluororesin layer (see, for example, PTL 3) are disclosed as a protective layer of the FET.

However, a typical organic material has a problem that deterioration of TFT properties is caused as the organic material is brought into contact with an oxide semiconductor. Moreover, the fluororesin layer causes relatively small deterioration of the TFT properties, but which is not sufficiently small for use.

Accordingly, there is currently a need for a field-effect transistor, which enables high speed operation, and exhibits high reliability.

CITATION LIST

Patent Literature

PTL 1: Japanese Patent Application Laid-Open (JP-A) No. 2008-205469
PTL 2: JP-A No. 2010-103203
PTL 3: JP-A No. 2007-299913
PLT 4: JP-A No. 2010-182819
PLT 5: JP-A No. 2011-77515
PLT 6: JP-A No. 2011-222788

Non-Patent Literature

NPL 1: K. Nomura, and five others, Room-temperature fabrication of transparent flexible thin-film transistors using amorphous oxide semiconductors, NATURE, VOL. 432, No. 25, November, 2004, pp. 488-492

SUMMARY OF INVENTION

Technical Problem

The present invention aims to solve the aforementioned various problems, and to achieve the following object. Specifically, an object of the present invention is to provide a field-effect transistor, which can be operated at high speed, and has high reliability.

Solution to Problem

The means for solving the aforementioned problems is as follows.

The field-effect transistor of the present invention contains:
a substrate;
a protective layer;
a gate insulating layer formed between the substrate and the protective layer;
a source electrode and a drain electrode, which are formed to be in contact with the gate insulating layer;
a semiconductor layer, which is formed at least between the source electrode and the drain electrode, and is in contact with the gate insulating layer, the source electrode, and the drain electrode; and
a gate electrode, which is formed at an opposite side to the side where the semiconductor layer is provided, with the gate insulating layer being between the gate electrode and the semiconductor layer, and is in contact with the gate insulating layer, wherein the protective layer contains a metal oxide composite, which contains at least Si and alkaline earth metal.

Advantageous Effects of Invention

The present invention can solve the aforementioned various problems in the art, and can provide a field-effect transistor, which can be operated at high speed, and has high reliability.

DESCRIPTION OF EMBODIMENTS (Field-Effect Transistor)

Figure 1:
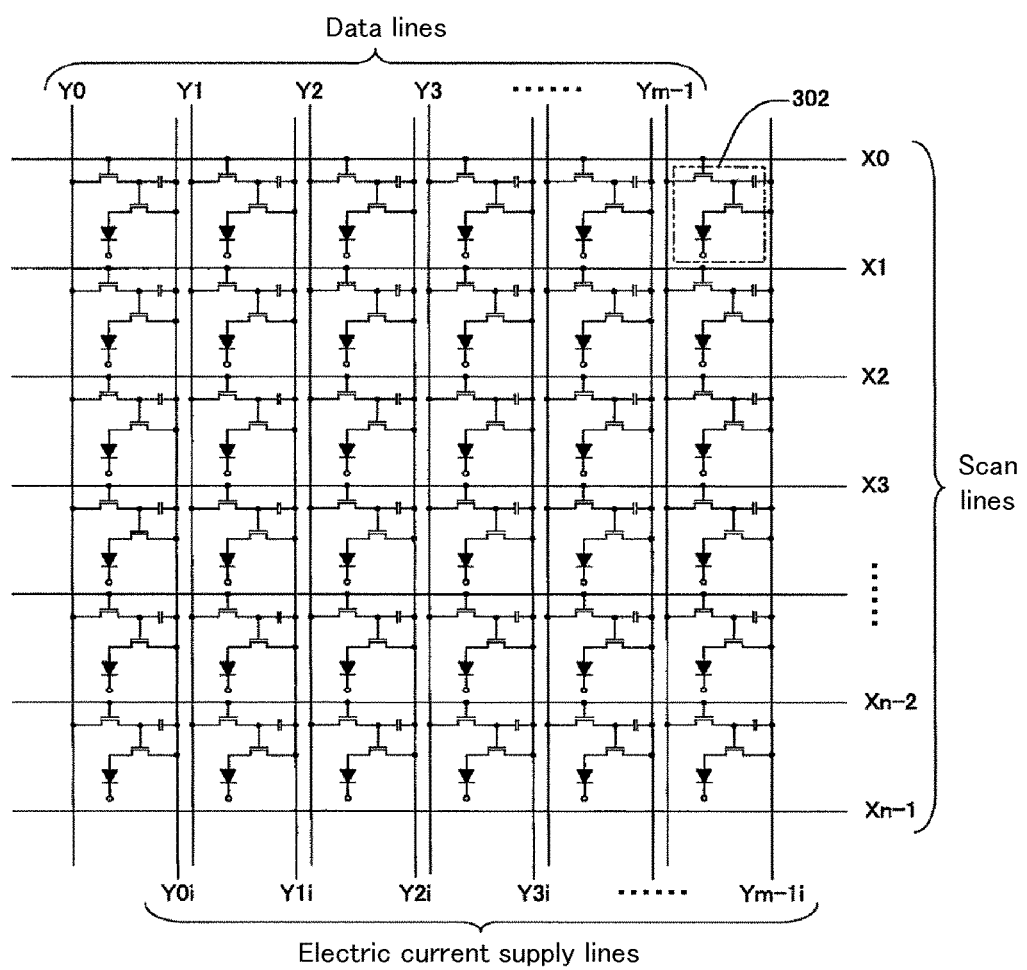
FIG. 1 is a diagram for explaining an image display device.

The field-effect transistor of the present invention contains at least a substrate, a protective layer, a gate insulating layer, a source electrode, a drain electrode, a semiconductor layer, and a gate electrode, and may further contain other members according to the necessity.

<Substrate>

A shape, structure, and size of the substrate are appropriately selected depending on the intended purpose without any limitation.

The material of the substrate is appropriately selected depending on the intended purpose without any limitation, and examples thereof include glass, and plastic.

The glass is appropriately selected depending on the intended purpose without any limitation, and examples thereof include non-alkali glass, and silica glass.

The plastic material is appropriately selected depending on the intended purpose without any limitation, and examples thereof include polycarbonate (PC), polyimide (PI), polyethylene terephthalate (PET), and polyethylene naphthalate (PEN).

Note that, a pre-treatment, such as oxygen plasma, UV ozone, and UV radiation washing, is preferably performed on the substrate to clean a surface thereof and to improve adhesion with another layer.

<Protective Layer>

The protective layer is appropriately selected depending on the intended purpose without any limitation, provided that the protective layer contains a metal oxide composite containing at least silicon (Si) and alkaline earth metal.

The protective layer is preferably composed of the metal oxide composite per se.

The protective layer is typically formed at the upper position from the substrate.

In the metal oxide composite, $SiO_2$ composed with Si forms an amorphous structure. Moreover, the alkaline earth metal has a function of cleaving a Si—O bond. Therefore, dielectric constant and linear expansion coefficient of the metal oxide composite to be formed can be controlled by a composition ratio.

The metal oxide composite preferably contains Al (aluminum), or B (boron), and a combination of Al and B. Similarly to $SiO_2$, $Al_2O_3$ composed with Al and $B_2O_3$ composed with B form an amorphous structure, and therefore an amorphous structure is even more stably obtained in the metal oxide composite, and a more uniform insulating film can be formed. Moreover, the alkaline earth metal also cleaves an Al—O bond and B—O bond, similarly to the Si—O. Therefore, dielectric constant and linear expansion coefficient of the metal oxide composite to be formed can be controlled by a composition ratio.

Examples of the alkaline earth metal include Be (beryllium), Mg (magnesium), Ca (calcium), Sr (strontium), and Ba (barium). Among them, preferred are magnesium (Mg), calcium (Ca), strontium (Sr), and barium (Ba).

These alkaline earth metal elements may be used alone or in combination.

A ratio of Si, a ratio of a total of Al and B, and a ratio of the alkaline earth metal in the metal oxide composite are appropriately selected depending on the intended purpose without any limitation, but they are respectively the following ranges.

The ratio of Si in the metal oxide composite based on the oxide ($SiO_2$) conversion is preferably 30.0 mol % to 95.0 mol %, more preferably 50.0 mol % to 90.0 mol %.

The ratio of the alkaline earth metal oxide in the metal oxide composite based on the oxide (BeO, MgO, CaO, SrO, BaO) conversion is preferably 5.0 mol % to 40.0 mol %, more preferably 10.0 mol % to 30.0 mol %.

The ratio of a total of Al and B in the metal oxide composite based on the oxide ($Al_2O_3$, $B_2O_3$) conversion is preferably 1.0 mol % to 50.0 mol %, more preferably 5.0 mol % to 30.0 mol %.

In the case where the metal oxide composite contains Al, or B, or a combination of Al and B, the ratio of the alkaline earth metal oxide based on the oxide (BeO, MgO, CaO, SrO, BaO) conversion is preferably 1.0 mol % to 30.0 mol %, more preferably 5.0 mol % to 20.0 mol %.

The ratio of oxides ($SiO_2$, BeO, MgO, CaO, SrO, BaO, $Al_2O_3$, $B_2O_3$) in the metal oxide composite can be calculated, for example, by analyzing a positive ion element of the oxide by X-ray fluorescence analysis or electron probe microanalysis (EPMA).

The dielectric constant of the protective layer is appropriately selected depending on the intended purpose without any limitation, but it is preferably 7.0 or lower, more preferably 6.0 or lower, as such dielectric constant of the protective layer can inhibit signal delay, and contribute to high speed operation.

The dielectric constant can be measured, for example, by preparing a capacitor, in which a lower electrode, a dielectric layer (the protective layer), and an upper electrode are laminated, and measuring by means of LCR meter (4284A, manufactured by Agilent).

The linear expansion coefficient of the protective layer is appropriately selected depending on the intended purpose without any limitation, but it is preferably $30.0 \times 10^{-7}$ or greater, more preferably $30.0 \times 10^{-7}$ to $60.0 \times 10^{-7}$, as with such linear expansion coefficient, pealing is inhibited, and reliability is more enhanced.

The linear expansion coefficient can be measured, for example, by means of a thermomechanical analysis device (8310 series, manufactured by Rigaku Corporation). In this measurement, the linear expansion coefficient can be measured by measuring a measuring sample, which is separately produced with the same composition to that of the protective layer, without producing the field-effect transistor.

The average thickness of the protective layer is appropriately selected depending on the intended purpose without any limitation, but it is preferably 10 nm to 1,000 nm, and more preferably 20 nm to 500 nm.

—Formation Method of Protective Layer—

A formation method of the protective layer is appropriately selected depending on the intended purpose without any limitation, and examples thereof include a method containing forming a film by a vacuum process, such as sputtering, pulse laser deposition (PLD), chemical vapor deposition (CVD), and atomic layer deposition (ALD), followed by patterning the film by photolithography.

Moreover, a film can be also formed by preparing a coating liquid containing a precursor of the metal oxide composite (a coating liquid for forming the protective layer), applying or printing the coating liquid onto a subject to be coated, and baking the applied or printed coating liquid under the appropriate conditions.

——Coating Liquid for Forming the Protective Layer (Coating Liquid for Forming Insulating Film)——

The coating liquid for forming the protective layer (also referred to as a coating liquid for forming an insulating film) contains at least a silicon-containing compound, an alkaline earth metal-containing compound, and a solvent, preferably further contains an aluminum-containing compound, or a boron-containing compound, or the both, and may further contain other components according to the necessity.

Currently, developments of printed electronics using a coating process, which can realize low cost production, have been actively conducted, to replace a vacuum process, which requires expensive equipments, such as sputtering, CVD, and dry etching. As for a protective layer of a semiconductor, disclosed are methods for forming a protective layer by applying polysilazane (see, for example, JP-A No. 2010-103203), or spin-on glass.

However, a coating liquid composed only of $SiO_2$ precursor, such as of polysilazane, and spin-on glass needs to be baked at 450° C. or higher in order to decompose an organic material to form a fine insulating film. In order to decompose an organic material at the temperature equal to or lower than the aforementioned temperature, it is necessary to use, in combination with heating, a reaction accelerating means, such as a microwave processing (see, for example, JP-A No. 2010-103203), use of a catalyst, and baking in a vapor atmosphere (Japanese Patent (JP-B) No. 3666915). Therefore, there are problems, such as a complex baking process, high cost, and reduction in insulating properties due to impurity residues.

Compared to the above, the coating liquid for forming the protective layer contains a precursor of alkaline earth metal oxide, which has lower decomposition temperature than that of the $SiO_2$ precursor. Therefore, the precursor in the coating liquid for forming the protective layer is decomposed at temperature lower than that of the coating liquid composed only of the $SiO_2$ precursor, i.e., lower than 450° C., to form a fine insulating film. As the coating liquid for forming the protective layer further contains an $Al_2O_3$ precursor, or a $B_2O_3$ precursor, or a combination thereof, which have, similarly to the precursor of alkaline earth metal oxide, lower decomposition temperature than that of the $SiO_2$ precursor, an effect of forming a fine insulating film at low temperature can be enhanced.

——Silicon-Containing Compound——

Examples of the silicon-containing compound include an inorganic silicon compound, and an organic silicon compound.

Examples of the inorganic silicon compound include tetrachlorosilane, tetrabromosilane, and tetraiodosilane.

The organic silicon compound is appropriately selected depending on the intended purpose without any limitation, provided that it is a compound containing a silicon atom, and an organic group. The silicon and the organic group are bonded together, for example, with an ionic bond, covalent bond, or coordinate bond.

The organic group is appropriately selected depending on the intended purpose without any limitation, and examples thereof include an alkyl group that may have a substituent, an alkoxy group that may have a substituent, an acyloxy group that may have a substituent, and a phenyl group that may have a substituent. Examples of the alkyl group include a C1-C6 alkyl group. Examples of the alkoxy group include a C1-C6 alkoxy group. Examples of the acyloxy group include C1-C10 acyloxy group.

Examples of the organic silicon compound include tetramethoxysilane, tetraethoxysilane, tetraisopropoxysilane, tetrabutoxysilane, 1,1,1,3,3,3-hexamethylsilazane (HMDS), bis(trimethylsilyl)acetylene, triphenylsilane, silicon 2-ethylhexanoate, and tetraacetoxysilane.

An amount of the silicon-containing compound in the coating liquid for forming the protective layer is appropriately selected depending on the intended purpose without any limitation.

——Alkaline Earth Metal-Containing Compound——

Examples of the alkaline earth metal-containing compound include an inorganic alkaline earth metal compound, and an organic alkaline earth metal compound.

Examples of alkaline earth metal in the alkaline earth metal-containing compound include Be (beryllium), Mg (magnesium), Ca (calcium), Sr (strontium), and Ba (barium).

Examples of the inorganic alkaline earth metal compound include alkaline earth metal nitric acid salt, alkaline earth metal sulfuric acid salt, alkaline earth metal chloride, alkaline earth metal fluoride, alkaline earth metal bromide, alkaline earth metal iodide, and alkaline earth metal phosphide. Examples of the alkaline earth metal nitric acid salt include magnesium nitrate, calcium nitrate, strontium nitrate, and barium nitrate. Examples of the alkaline earth metal sulfuric acid salt include magnesium sulfate, calcium sulfate, strontium sulfate, and barium sulfate. Examples of the alkaline earth metal chloride include magnesium chloride, calcium chloride, strontium chloride, and barium chloride. Examples of the alkaline earth metal fluoride include magnesium fluoride, calcium fluoride, strontium fluoride, and barium fluoride. Examples of the alkaline earth metal bromide include magnesium bromide, calcium bromide, strontium bromide, and barium bromide. Examples of the alkaline earth metal iodide include magnesium iodide, calcium iodide, strontium iodide, and barium iodide. Examples of the alkaline earth metal phosphide include magnesium phosphide, and calcium phosphide.

The organic alkaline earth metal compound is appropriately selected depending on the intended purpose without any limitation, provided that it contains alkaline earth metal and an organic group. The alkaline earth metal and the organic group are bonded together, for example, with an ionic bond, covalent bond, or coordinate bond.

The organic group is appropriately selected depending on the intended purpose without any limitation, and examples thereof include an alkyl group that may have a substituent, an alkoxy group that may have a substituent, an acyloxy group that may have a substituent, a phenyl group that may have a substituent, an acetylacetonato group that may have a substituent, and a sulfonic acid group that may have a substituent. Examples of the alkyl group include a C1-C6 alkyl group. Examples of the alkoxy group include a C1-C6 alkoxy group. Examples of the acyloxy group include: a C1-C10 acyloxy group; an acyloxy group part of which is substituted with a benzene ring, such as benzoic acid; an acyloxy group part of which is substituted with a hydroxyl group, such as lactic acid; and an acyloxy group having two or more carbonyl groups, such as oxalic acid, and citric acid.

Examples of the organic alkaline earth metal compound include magnesium methoxide, magnesium ethoxide, diethyl magnesium, magnesium acetate, magnesium formate, magnesium acetylacetonate, magnesium 2-ethylhexanoate, magnesium lactate, magnesium naphthenate, magnesium citrate, magnesium salicylate, magnesium benzoate, magnesium oxalate, magnesium trifluoromethanesulfonate, calcium methoxide, calcium ethoxide, calcium acetate, calcium formate, calcium acetylacetonate, calcium dipivaloylmethanato, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, strontium acetylacetonate, strontium 2-ethylhexanoate, strontium lactate, strontium naphthenate, strontium salicylate, strontium oxalate, barium ethoxide, barium isopropoxide, barium acetate, barium formate, barium acetylacetonate, barium 2-ethylhexanoate, barium lactate, barium naphthenate, barium neodecanoate, barium oxalate, barium benzoate, and barium trifluoromethanesulfonate.

An amount of the alkaline earth metal-containing compound in the coating liquid for forming the protective layer is appropriately selected depending on the intended purpose without any limitation.

————Aluminum-Containing Compound————

Examples of the aluminum-containing compound include an inorganic aluminum compound, and an organic aluminum compound.

Examples of the inorganic aluminum compound include aluminum chloride, aluminum nitrate, aluminum bromide, aluminum hydroxide, aluminum borate, aluminum trifluoride, aluminum iodide, aluminum sulfate, aluminum phosphate, and aluminum ammonium sulfate.

The organic aluminum compound is appropriately selected depending on the intended purpose without any limitation, provided that it is a compound containing aluminum and an organic group. The aluminum and the organic group are bonded together, for example, with an ionic bond, covalent bond, or coordinate bond.

The organic group is appropriately selected depending on the intended purpose without any limitation, and examples thereof include an alkyl group that may have a substituent, an alkoxy group that may have a substituent, an acyloxy group that may have a substituent, an acetylacetonato group that may have a substituent, and a sulfonic acid group that may have a substituent. Examples of the alkyl group include a C1-C6 alkyl group. Examples of the alkoxy group include a C1-C6 alkoxy group. Examples of the acyloxy group include: a C1-C10 acyloxy group; an acyloxy group part of which is substituted with a benzene ring, such as benzoic acid; an acyloxy group part of which is substituted with a hydroxyl group, such as lactic acid; and an acyloxy group having two or more carbonyl groups, such as oxalic acid, and citric acid.

Examples of the organic aluminum compound include aluminum isopropoxide, aluminum-sec-butoxide, triethyl aluminum, diethyl aluminum ethoxide, aluminum acetate, aluminum acetylacetonate, aluminum hexafluoroacetylacetonate, aluminum 2-ethylhexanoate, aluminum lactate, aluminum benzoate, aluminum di(s-butoxide) acetoacetic ester chelate, and aluminum trifluoromethanesulfonate.

An amount of the aluminum-containing compound in the coating liquid for forming the protective layer is appropriately selected depending on the intended purpose without any limitation.

————Boron-Containing Compound————

Examples of the boron-containing compound include an inorganic boron compound, and an organic boron compound.

Examples of the inorganic boron compound include orthoboric acid, boron oxide, boron tribromide, tetrafluoroboric acid, ammonium borate, and magnesium borate. Examples of the boron oxide include diboron dioxide, diboron trioxide, tetraboron trioxide, and tetraboron pentaoxide.

The organic boron compound is appropriately selected depending on the intended purpose without any limitation, provided that it is a compound containing boron and an organic group. The boron and the organic group are bonded together, for example, with an ionic bond, covalent bond, or coordinate bond.

The organic group is appropriately selected depending on the intended purpose without any limitation, and examples thereof include an alkyl group that may have a substituent, an alkoxy group that may have a substituent, an acyloxy group that may have a substituent, a phenyl group that may have a substituent, a sulfonic acid group that may have a substituent, and a thiophene group that may have a substituent. Examples of the alkyl group include a C1-C6 alkyl group. Examples of the alkoxy group include a C1-C6 alkoxy group. The alkoxy group includes an organic group, which contains two or more oxygen atoms among which two oxygen atoms are bonded to boron, and form a ring structure with boron. Moreover, the alkoxy group includes an alkoxy group, where an alkyl group contained in the alkoxy group is substituted with an organic silyl group. Examples of the acyloxy group include a C1-C10 acyloxy group.

Examples of the organic boron compound include triethyl borane, (R)-5,5-diphenyl-2-methyl-3,4-propano-1,3,2-oxazaborolidine, triisopropyl borate, 2-isopropoxy-4,4,5,5-tetramethyl-1,3,2-dioxaborolane, bis(hexyleneglycolato)diboron, 4-(4,4,5,5-tetramethyl-1,3,2-dioxaborolan-2-yl)-1H-pyrazole, tert-butyl-N-[4-(4,4,5,5-tetramethyl-1,2,3-dioxaborolan-2-yl)phenyl]carbamate, phenyl boronic acid, 3-acetylphenyl boronic acid, boron trifluoride acetic acid complex, boron trifluoride sulfolane complex, 2-thiophene boronic acid, and tris(trimethylsilyl)borate.

An amount of the boron-containing compound in the coating liquid for forming the protective layer is appropriately selected depending on the intended purpose without any limitation.

———Solvent———

The solvent is appropriately selected depending on the intended purpose without any limitation, provided that it is a solvent that stably dissolves or disperses the aforementioned various compounds. Examples of the solvent include toluene, xylene, mesitylene, isopropanol, ethyl benzoate, N,N-dimethylformamide, propylene carbonate, 2-ethylhexanoate, mineral spirits, dimethylpropylene urea, 4-butyrolactone, 2-methoxyethanol, and water.

An amount of the solvent in the coating liquid for forming the protective layer is appropriately selected depending on the intended purpose without any limitation.

A ratio of the silicon-containing compound and the alkaline earth metal-containing compound (the silicon-containing compound: the alkaline earth metal-containing compound) in the coating liquid for forming the protective layer is appropriately selected depending on the intended purpose without any limitation, but the ratio based on the oxide ($SiO_2$, BeO, MgO, CaO, SrO, BaO) conversion is preferably 30.0 mol % to 95.0 mol %:5.0 mol % to 40.0 mol %, more preferably 50.0 mol % to 90.0 mol %:10.0 mol % to 30.0 mol %.

A ratio between the silicon-containing compound, the alkaline earth metal-containing compound, and a total of the aluminum-containing compound and the boron-containing compound (the silicon-containing compound: the alkaline earth metal-containing compound: the total of the aluminum-containing compound and the boron-containing compound) in the coating liquid for forming the protective layer is appropriately selected depending on the intended purpose without any limitation, but the ratio based on the oxide ($SiO_2$, BeO, MgO, CaO, SrO, BaO, $Al_2O_3$, $B_2O_3$) conversion is preferably 30.0 mol % to 95.0 mol %:1.0 mol % to 30.0 mol %:1.0 mol % to 50.0 mol %, more preferably 50.0 mol % to 90.0 mol %:5.0 mol % to 20.0 mol %:5.0 mol % to 30.0 mol %.

———Formation Method of Protective Layer Using Coating Liquid for Forming the Protective Layer———

One example of a formation method of the protective layer using the coating liquid for forming the protective layer is explained hereinafter.

The formation method of the protective layer contains a coating step, and a heat processing step, and may further contain other steps according to the necessity.

The coating step is appropriately selected depending on the intended purpose without any limitation, provided that it contains coating a subject to be coated with the coating liquid for forming the protective layer.

A method of the coating is appropriately selected depending on the intended purpose without any limitation, and examples thereof include: a method containing forming a film through a solution process, followed by patterning through photolithography; and a method containing directly forming a film of an intended shape through a printing process, such as inkjet printing, nano printing, and gravure printing.

Examples of the solution process include dip coating, spin coating, die coating, and nozzle printing.

The heat processing step is appropriately selected depending on the intended purpose without any limitation, provided that subjecting the coating liquid for forming the protective layer coated on the subject to a heat processing.

Note that, in the heat processing, the coating liquid for forming the protective layer coated on the subject may be dried by air drying.

The heat processing performs drying of the solvent, generation of the metal oxide composite, etc.

In the heat processing step, the drying of the solvent (referred to as a "drying step" hereinafter), and the generation of the metal oxide composite (referred to as a "generation step" hereinafter) are preferably performed at different temperature.

Specifically, it is preferred that, after drying the solvent, the temperature be elevated to perform the generation of the metal oxide composite.

At the time of the generation of the metal oxide composite, for example, decompositions of the silicon-containing compound, the alkaline earth metal-containing compound, the aluminum-containing compound, and the boron-containing compound are carried out.

The temperature for the drying step is appropriately selected depending on a solvent as contained, without any limitation. For example, the temperature thereof is 80° C. to 180° C. In the drying, it is effective to use a vacuum oven to reduce the temperature for the drying.

The duration of the drying step is appropriately selected depending on the intended purpose without any limitation, and it is, for example, 10 minutes to 1 hour.

The temperature of the generation step is appropriately selected depending on the intended purpose without any limitation, but it is preferably 100° C. or higher but lower than 450° C., more preferably 200° C. to 400° C.

The duration of the generation step is appropriately selected depending on the intended purpose without any limitation, and it is, for example, 1 hour to 5 hours.

Note that, in the heat processing step, the drying and the generation may be performed consecutively, or may be performed separately with a plurality of steps.

A method of the heat processing is appropriately selected depending on the intended purpose without any limitation, and examples thereof include a method containing heating the subject to be coated.

The atmosphere of the heat processing is appropriately selected depending on the intended purpose without any limitation, but it is preferably oxygen atmosphere. By performing the heat processing in the oxygen atmosphere, a decomposition product can be promptly discharged from the system, and generation of the metal oxide composite can be accelerated.

It is effective in the heat processing to apply ultraviolet rays having the wavelength of 400 nm or shorter to the material after the drying for accelerating a reaction of the generation. As ultraviolet rays having the wavelength of 400 nm or shorter is applied, chemical bonds of the organic material contained in the material after the drying are cut, to decompose the organic material. Therefore, the metal oxide composite can be efficiently formed.

The ultraviolet rays having the wavelength of 400 nm or shorter are is appropriately selected depending on the intended purpose without any limitation, and examples thereof include ultraviolet rays having the wavelength of 222 nm emitted from an excimer lamp.

Moreover, it is preferred that ozone be applied instead of or in addition to the application of the ultraviolet rays. By applying the ozone to the material after the drying, generation of oxide is accelerated.

<Gate Insulating Layer>

The gate insulating layer is appropriately selected depending on the intended purpose without any limitation, provided that it is an insulating layer formed between the substrate and the protective layer.

A material of the gate insulating layer is appropriately selected depending on the intended purpose without any limitation, and examples thereof include: materials that have been widely used for mass-production, such as $SiO_2$, $SiN_x$, and $Al_2O_3$; high dielectric constant materials, such as $La_2O_3$, and $HfO_2$; and organic materials such as polyimide (PI) and a fluororesin.

—Formation Method of Gate Insulating Layer—

A formation method of the gate insulating layer is appropriately selected depending on the intended purpose without any limitation, and examples thereof include: a vacuum film forming method, such as sputtering, chemical vapor deposition (CVD), and atomic layer deposition (ALD); and a printing method, such as spin coating, die coating, and inkjet printing.

The average film thickness of the gate insulating layer is appropriately selected depending on the intended purpose without any limitation, but it is preferably 50 nm to 3 µm, more preferably 100 nm to 1 µm.

<Source Electrode and Drain Electrode>

The source electrode and the drain electrode are appropriately selected depending on the intended purpose without any limitation, provided that they are electrodes for extracting electric current.

The source electrode and the drain electrode are formed to be in contact with the gate insulating layer.

A material of the source electrode and drain electrode is appropriately selected depending on the intended purpose without any limitation, and examples thereof include: metal, such as Mo, Al, Ag, and Cu; alloy thereof; transparent electroconductive oxide, such as indium tin oxide (ITO), and antimony-doped tin oxide (ATO); and organic electroconductor, such as polyethylene dioxythiophene (PEDOT), and polyaniline (PANT).

—Formation Method of Source Electrode and Drain Electrode—

A formation method of the source electrode and the drain electrode is appropriately selected depending on the intended purpose without any limitation, and examples thereof include: (i) a method containing forming a film through sputtering or dip coating, followed by patterning the film through photolithography; and (ii) a method containing directly forming a film of the desired shape through a printing process, such as inkjet printing, nano printing, and gravure printing.

The average film thickness of each of the source electrode and the drain electrode is appropriately selected depending on the intended purpose without any limitation, but it is preferably 20 nm to 1 µm, more preferably 50 nm to 300 nm.

<Semiconductor Layer>

The semiconductor layer is formed at least between the source electrode and the drain electrode.

The semiconductor layer is in contact with the gate insulating layer, the source electrode, and the drain electrode.

The position "between the source electrode and the drain electrode" is appropriately selected depending on the intended purpose without any limitation, provided that it is a position where the semiconductor layer can make the field-effect transistor function together with the source electrode and the drain electrode.

A material of the semiconductor layer is appropriately selected depending on the intended purpose without any limitation, and examples thereof include silicon semiconductor, and oxide semiconductor. Examples of the silicon semiconductor include polycrystalline silicon (p-Si), and amorphous silicon (a-Si). Examples of the oxide semiconductor include In—Ga—Zn—O, I—Z—O, and In—Mg—O. Among them, the oxide semiconductor is preferable.

—Formation Method of Semiconductor Layer—

A formation method of the semiconductor layer is appropriately selected depending on the intended purpose without any limitation, and examples thereof include: a method containing forming a film through a vacuum process, such as sputtering, pulse laser deposition (PLD), CVD, and atomic layer deposition (ALD), or a solution process, such as dip coating, spin coating, and die coating, followed by patterning through lithography; and a method containing directly forming a film of an intended shape through a printing process, such as inkjet printing, nano printing, and gravure printing.

The average film thickness of the semiconductor layer is appropriately selected depending on the intended purpose without any limitation, but it is preferably 5 nm to 1 µm, 10 nm to 0.5 µm.

<Gate Electrode>

The gate electrode is formed at an opposite side to the side where the semiconductor layer is provided, with the gate insulating layer being between the gate electrode and the semiconductor layer.

The gate electrode is in contact with the gate insulating layer.

A material of the gate electrode is appropriately selected depending on the intended purpose without any limitation, and examples thereof include: metal, such as Mo, Al, Ag, and Cu; alloy thereof; transparent electroconductive oxide, such as indium tin oxide (ITO), and antimony-doped tin oxide (ATO); and organic electroconductor, such as polyethylene dioxythiophene (PEDOT), and polyaniline (PANT).

—Formation Method of Gate Electrode—

A formation method of the gate electrode is appropriately selected depending on the intended purpose without any limitation, and examples thereof include: (i) a method containing forming a film through sputtering or dip coating, followed by patterning the film through photolithography; and (ii) a method containing directly forming a film of the desired shape through a printing process, such as inkjet printing, nano printing, and gravure printing.

The average film thickness of the gate electrode is appropriately selected depending on the intended purpose without any limitation, but it is preferably 20 nm to 1 µm, more preferably 50 nm to 300 nm.

A structure of the field-effect transistor is appropriately selected depending on the intended purpose without any limitation, and examples thereof include the following structures of the field-effect transistors.

(1) A field-effect transistor containing the substrate, the gate electrode formed on the substrate, the gate insulating layer formed on the gate electrode, the source electrode and drain electrode both formed on the gate insulating layer, the semiconductor layer formed between the source electrode and the drain electrode, and the protective layer formed on the semiconductor layer.

(2) A field-effect transistor containing the substrate, the source electrode and drain electrode both formed on the substrate, the semiconductor layer formed between source electrode and the drain electrode, the gate insulating layer formed on the source electrode, the drain electrode, and the semiconductor layer, the gate electrode formed on the gate insulating layer, and the protective layer formed on the gate electrode.

Figure 3A:
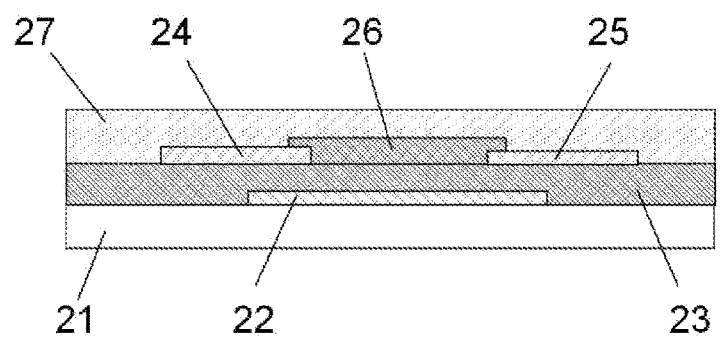
FIG. 3A is a diagram illustrating one example of the field-effect transistor of the present invention (bottom contact/bottom gate).
Figure 3B:
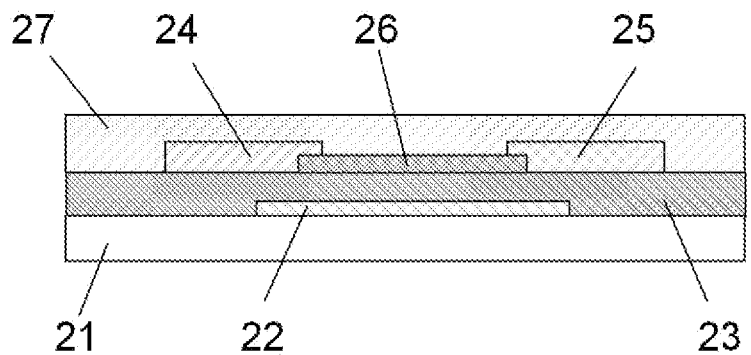
FIG. 3B is a diagram illustrating one example of the field-effect transistor of the present invention (top contact/bottom gate).

Examples of the field-effect transistor having the structure of (1) include a bottom contact/bottom gate field-effect transistor (FIG. 3A), and a top contact/bottom gate field-effect transistor (FIG. 3B).

Figure 3C:
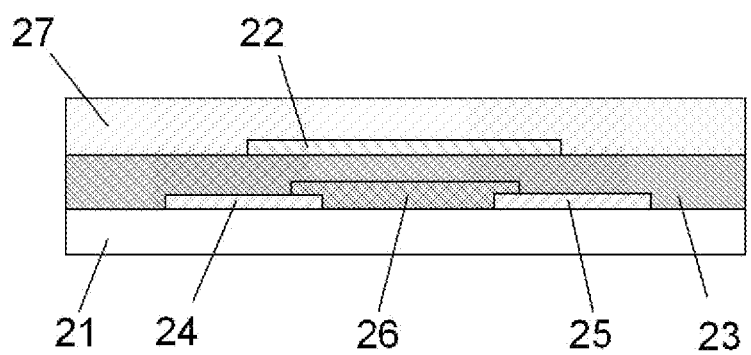
FIG. 3C is a diagram illustrating one example of the field-effect transistor of the present invention (bottom contact/top gate).
Figure 3D:
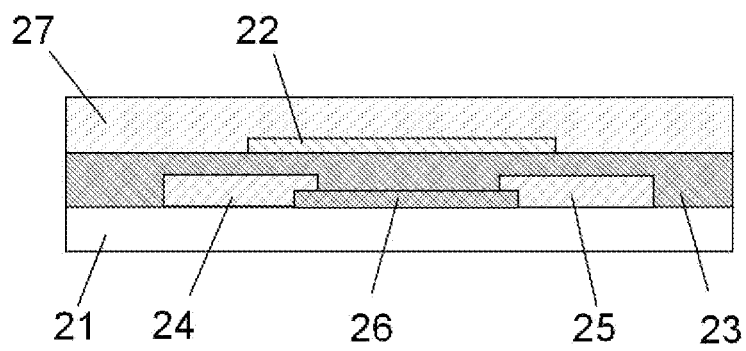
FIG. 3D is a diagram illustrating one example of the field-effect transistor of the present invention (top contact/top gate).

Examples of the field-effect transistor having the structure of (2) include a bottom contact/top gate field-effect transistor (FIG. 3C), and a top contact/top gate field-effect transistor (FIG. 3D).

In FIGS. A to 3D, the reference 21 denotes a substrate, 22 denotes a gate electrode, 23 denotes a gate insulating layer, 24 denotes a source electrode, 25 denotes a drain electrode, 26 denotes an oxide semiconductor layer, and 27 denotes a protective layer.

The field-effect transistor can be suitably used for the below-mentioned display element, but use thereof is not limited to the display element. For example, the field-effect transistor can be used for an IC card, ID tag, etc.

(Display Element)

The display element of the present invention contains at least an optical control element, and a driving circuit configured to drive the optical control element, and may further contain other members, if necessary.

<Optical Control Element>

The optical control element is appropriately selected depending on the intended purpose without any limitation, provided that it is an element which controls optical output according to a driving signal. Examples thereof include an electroluminescent (EL) element, an electrochromic (EC) element, a liquid crystal element, an electrophoretic element, and an electrowetting element.

<Driving Circuit>

The driving circuit is appropriately selected depending on the intended purpose without any limitation, provided that it us a circuit that has the field-effect transistor of the present invention, and drives the optical control element.

<Other Members>

Other members are appropriately selected depending on the intended purpose without any limitation.

The display element can achieve a long service optical control and high speed operation, as the display element contains the field-effect transistor of the present invention.

(Image Display Device)

The image display device of the present invention contains at least a plurality of display elements, a plurality of lines, and a display control device, and may further contain other members according to the necessity.

The image display device is a device configured to display an image according to image data.

<Display Elements>

The display elements are appropriately selected depending on the intended purpose without any limitation, provided that they are the display elements of the present invention arranged in a matrix form.

<Lines>

The lines are appropriately selected depending on the intended purpose without any limitation, provided that they are each a line configured to individually apply gate voltage to each field-effect transistor in the display element.

<Display Control Device>

The display control device is appropriately selected depending on the intended purpose without any limitation, provided that it is capable of individually controlling the gate voltage of each of the field-effect transistors through a plurality of the line, according to the image data.

<Other Members>

Other members are appropriately selected depending on the intended purpose without any limitation.

The image display device can achieve long service life and high speed operation, as the image display device contains the display element of the present invention.

The image display device can be used as a display unit in mobile information devices (e.g., a mobile phone, a mobile music player, a mobile video player, an electronic book, and personal digital assistant (PDA)) or in imaging devices (e.g., a still camera, and a video camera). Moreover, the image display device can be used as a display unit for various information in a transporting system, such as a car, air craft, train, and ship. Further, the image display device can be used as a display unit for displaying various information in a measuring device, analysis device, medical device, or advertising media.

(System)

The system of the present invention contains at least the image display device of the present invention, and an image data forming device.

The image data forming device is a device, which is configured to create image data based on image information to be displayed, and to output the image data to the image display device.

The display element, image display device, and system of the present invention are explained with reference to drawings hereinafter.

First, as one example of the system of the present invention, a television device is explained.

The television device, which is one example of the system of the present invention, can have a structure, for example, as described in the paragraphs [0038] to [0058] and FIG. 1 of JP-A No. 2010-074148.

Next, the image display device of the present invention is explained.

Figure 2:
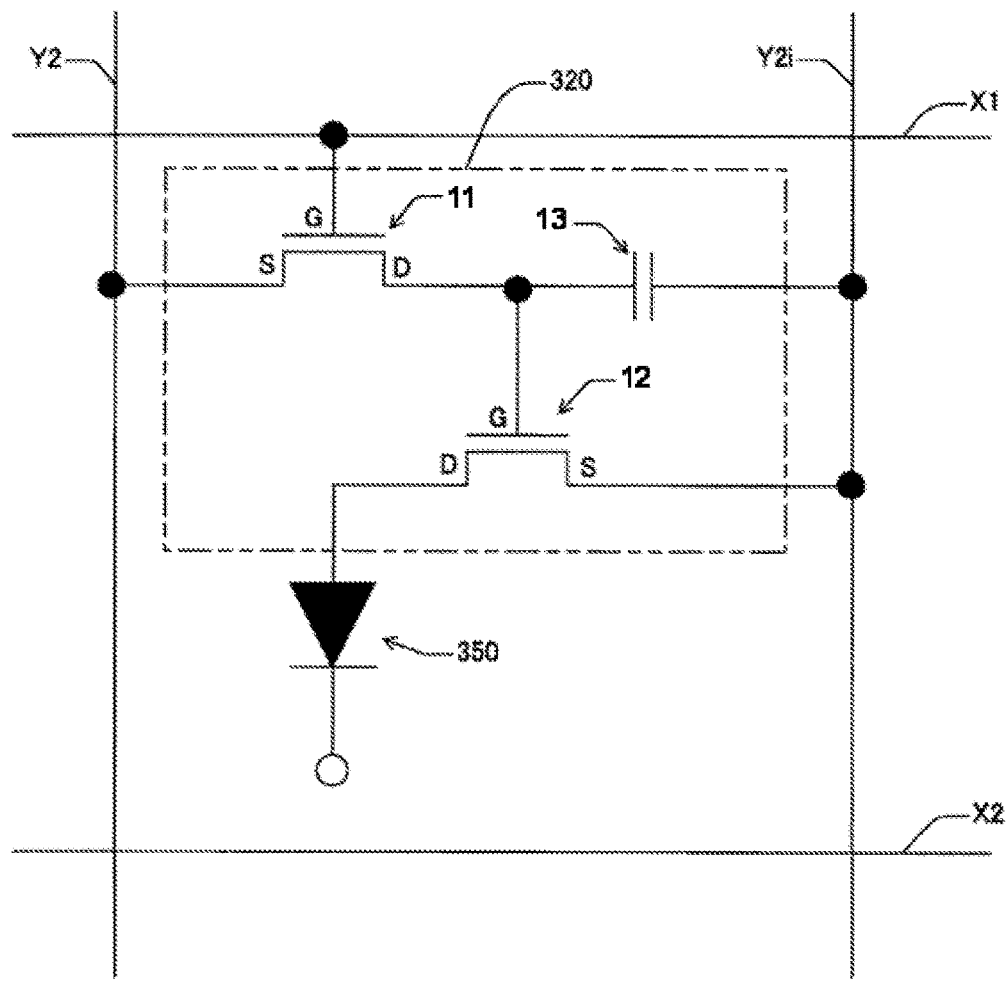
FIG. 2 is a diagram for explaining one example of the display element of the present invention.

The image display device of the present invention may have a structure, for example, as described in the paragraphs [0059] to [0060], and FIGS. 2 and 3 of JP-A No. 2010-074148.

Next, the display element of the present invention is explained with reference to drawings.

FIG. 1 is a diagram illustrating a display 310 in which display elements are arranged on a matrix. As illustrated in FIG. 1, the display 310 contains "n" number of scanning lines (X0, X1, X2, X3, . . . Xn−2, Xn−1) arranged along the X axis direction with a constant interval, "m" number of data lines (Y0, Y1, Y2, Y3, . . . Ym−1) arranged along the Y axis direction with a constant interval, and "m" number of electric current supply lines (Y0$i$, Y1$i$, Y2$i$, Y3$i$, . . . Ym−1$i$) arranged along the Y axis direction with a constant interval.

As described, the display element is specified with the scanning line and the data line.

FIG. 2 is a schematic structure diagram illustrating one example of the display element of the present invention.

As illustrated in FIG. 2 as an example, the display element contains an organic EL (luminescent) element 350, and a driving circuit 320 for making the organic EL element 350 emit. Namely, the display 310 is so called an active-matrix organic EL display. Moreover, the display 310 is a 32-inch color display. Note that, the size of the display is not limited to the aforementioned size.

The driving circuit 320 of FIG. 2 will be explained.

The driving circuit 320 contains two field-effect transistors 11 and 12, and a capacitor 13.

The field-effect transistor 11 functions as a switching element. The gate electrode G is connected with a certain scanning line, and the source electrode S is connected with a certain data line. Moreover, the drain electrode D is connected with one terminal of the capacitor 13.

The capacitor 13 is used to store the state of the field-effect transistor 11, i.e. to store data. The other terminal of the capacitor 13 is connected to a certain electric current supply line.

The field-effect transistor 12 is used to supply large electric current to the organic EL element 350. the gate electrode G is connected to the field-effect transistor 11 of the drain electrode D. The drain electrode D is connected to a positive electrode of the organic EL element 350, and the source electrode S is connected to certain electric current supply line.

When the field-effect transistor 11 is turned in the "on" state, the organic EL element 350 is driven by the field-effect transistor 12.

As illustrated in FIG. 3A as one example thereof, the field-effect transistors 11, 12 each contain a substrate 21, a gate electrode 22, a gate insulating layer 23, a source electrode 24, a drain electrode 25, an oxide semiconductor layer 26, and a protective layer 27.

The field-effect transistors 11, 12 can be formed with the materials, by the process, which are explained in the descriptions of the field-effect transistor of the present invention.

Figure 4:
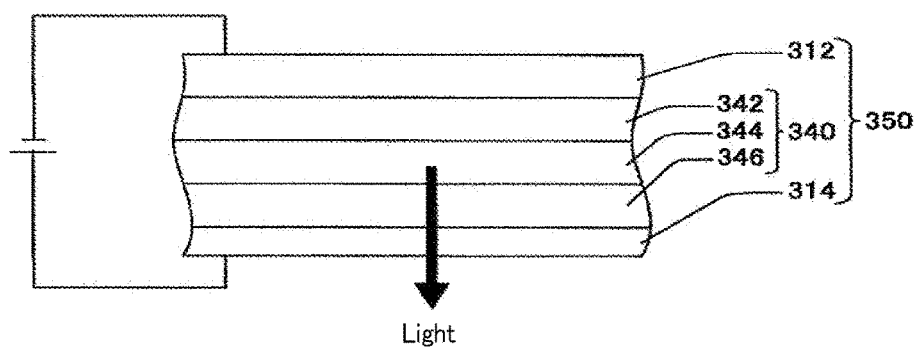
FIG. 4 is a schematic structure diagram illustrating one example of an organic EL element.

FIG. 4 is a schematic structure diagram illustrating one example of an organic EL element.

In FIG. 4, the organic EL element 350 contains a negative electrode 312, a positive electrode 314, and an organic EL thin film layer 340.

A material of the negative electrode 312 is appropriately selected depending on the intended purpose without any limitation, and examples thereof include aluminum (Al), magnesium (Mg)-silver (Ag) alloy, aluminum (Al)-lithium (Li) alloy, and indium tin oxide (ITO). Note that, the magnesium (Mg)-silver (Ag) alloy forms a high reflectance electrode with a sufficient thickness thereof, and an extremely thin film (less than about 20 nm) thereof forms a semi-transparent electrode. In FIG. 4, light is taken out from the side of the positive electrode, but light can be taken out from the side of the negative electrode, by making the negative electrode a transparent or semi-transparent electrode.

A material of the positive electrode 314 is appropriately selected depending on the intended purpose without any limitation, and examples thereof include indium tin oxide (ITO), indium zinc oxide (IZO), and silver (Ag)-neodymium (Nd) alloy. Note that, in the case where the silver alloy is used, a resulting electrode becomes a high reflectance electrode, which is suitable for taking light out from the side of the negative electrode.

The organic EL thin film layer 340 contains an electron transporting layer 342, a light emitting layer 344, and a hole transporting layer 346. The electron transporting layer 342 is connected to the negative electrode 312, and the hole transporting layer 346 is connected to the positive electrode 314. The light emitting layer 344 emits light, as the predetermined voltage is applied between the positive electrode 314 and the negative electrode 312.

Here, the electron transporting layer 342 and the light emitting layer 344 may form one layer. Moreover, an electron injecting layer may be provided between the electron transporting layer 342 and the negative electrode 312. Further, a hole injecting layer may be provided between the hole transporting layer 346 and the positive electrode 314.

In FIG. 4, as for the optical control element, the so-called "bottom emission" organic EL element, in which light is taken out from the side of the substrate, is explained. However, the optical control element may be a "top emission" organic EL element, in which light is taken out from the opposite side to the substrate.

Figure 5:
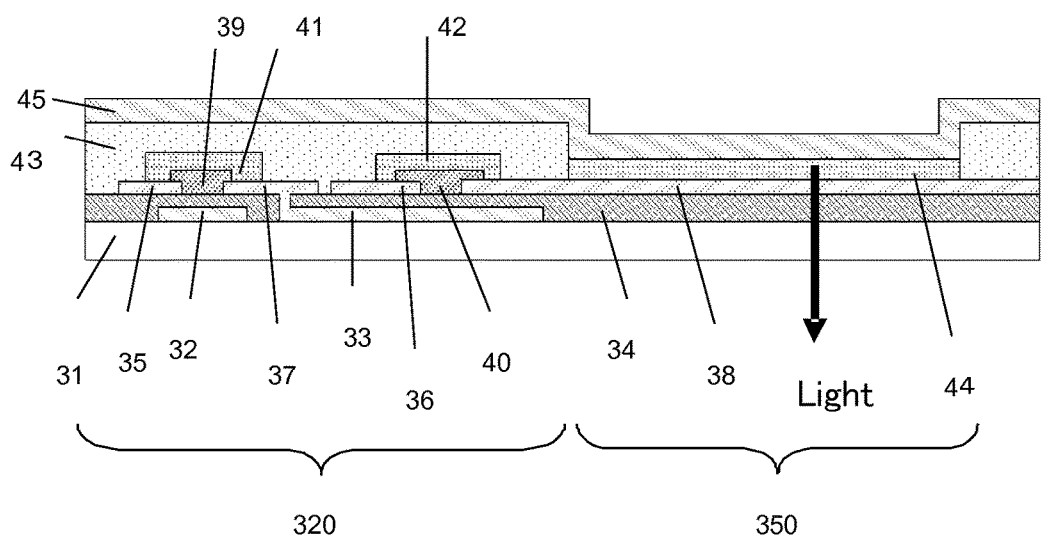
FIG. 5 is a schematic structure diagram illustrating one example of the display element of the present invention.

FIG. 5 depicts one example of the display element, in which the organic EL element 350 and the driving circuit 320 are combined.

The display element contains a substrate 31, first and second gate electrodes 32, 33, a gate insulating layer 34, first and second source electrodes 35, 36, first and second drain electrodes 37, 38, first and second oxide semiconductor layers 39, 40, first and second protective layers 41, 42, an interlayer insulating film 43, an organic EL layer 44, and a negative electrode 45. The first drain electrode 37 and the second gate electrode 33 are connected to the gate insulating layer 34 via a through-hole.

It is appeared in FIG. 5 that a capacitor is formed between the second gate electrode 33 and the second drain electrode 38 as a matter of practical convenience. In fact, a position at which a capacitor is formed is not restricted, and a capacitor having an appropriate capacity can be provided in an appropriate position.

In the display element of FIG. 5, moreover, the second drain electrode 38 functions as a positive electrode of the organic EL element 350.

The substrate 31, first and second gate electrodes 32, 33, gate insulating layer 34, first and second source electrodes 35, 36, first and second drain electrodes 37, 38, first and second oxide semiconductor layers 39, 40, and first and second protective layers 41, 42 can be formed with the materials, by the process explained in the descriptions of the field-effect transistor of the present invention.

A material of the interlayer insulating film 43 (leveling film) is appropriately selected depending on the intended purpose without any limitation, and examples thereof include: a resin, such as polyimide, acryl, and a fluororesin; a photosensitive resin using any of the aforementioned resins, and SOG (spin on glass). A process for forming the interlayer insulating film is appropriately selected depending on the intended purpose without any limitation. For example, a film may be directly formed to have a desired shape by spin coating, inkjet printing, slit coating, nozzle printing, gravure printing, or dip coating. In case of a photosensitive material, the film may be patterned by photolithography.

Production methods of the organic EL layer 44 and the negative electrode 45 are appropriately selected depending on the intended purpose without any limitation, and examples thereof include: a vacuum film forming method, such as vacuum deposition and sputtering; and a solution process, such as inkjet printing, and nozzle coating.

In the manner as described above, the display element that is the so-called "bottom emission" organic EL element, in which light is guided out from the side of the substrate, can be produced. In this case, the substrate 31, gate insulating layer 34, and second drain electrode (positive electrode) 38 need to be transparent.

Figure 6:
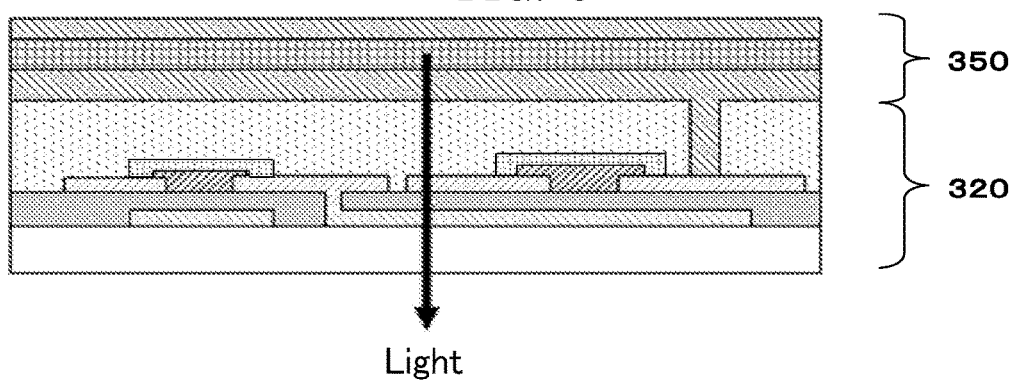
FIG. 6 is a schematic structure diagram illustrating another example of the display element of the present invention.

In FIG. 5, a structure where the organic EL element 350 is provided next to the driving circuit 320. However, the display element may have a structure where the organic EL element 350 is provided above the driving circuit 320 as illustrated in FIG. 6. In this case, the organic EL element is also "bottom emission" type where emission light is guided out from the side of the substrate, and therefore the driving circuit 320 needs to be transparent. As for the source and drain electrodes or positive electrode, use of transparent electroconductive oxide, such as ITO, $In_2O_3$, $SnO_2$, ZnO, Ga-doped ZnO, Al-doped ZnO, and Sb-doped $SnO_2$, is preferable.

Figure 7:
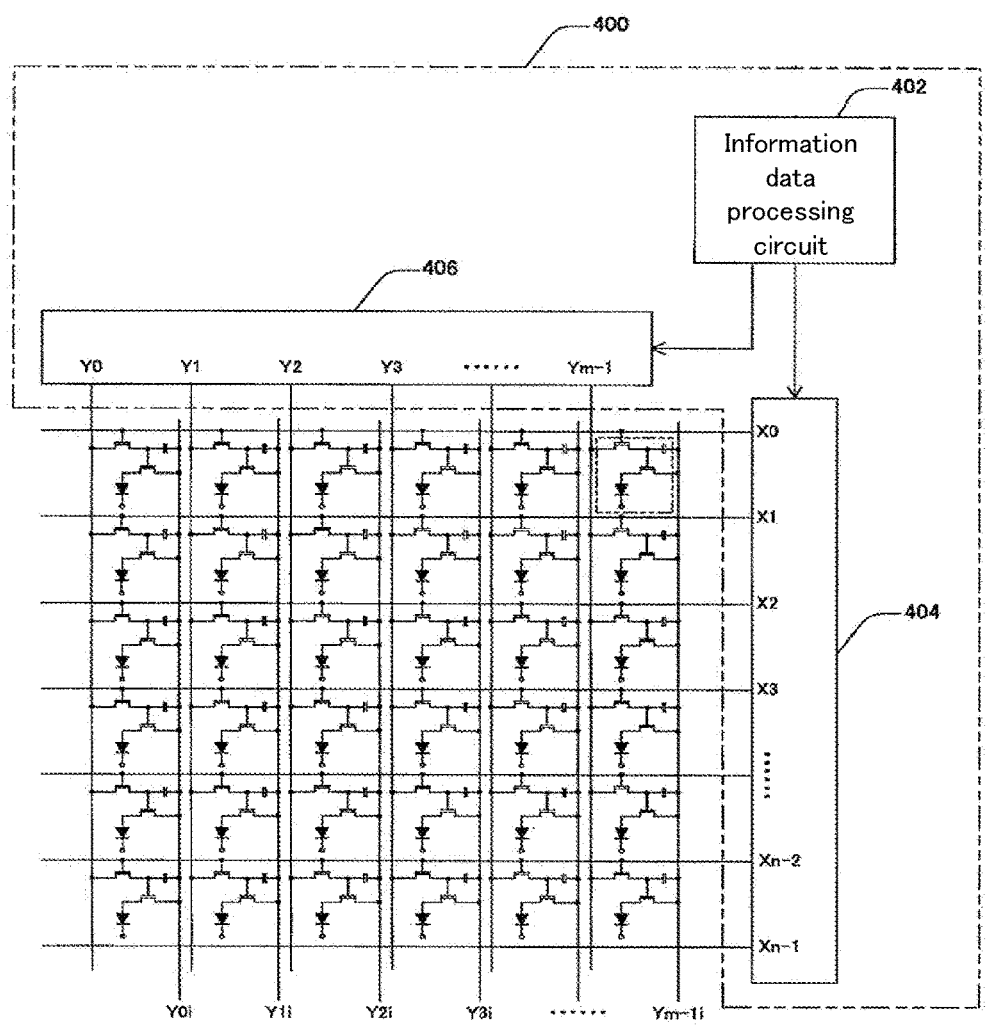
FIG. 7 is a diagram for explaining a display control device.

The display control device 400 contains an image data processing circuit 402, a scanning line driving circuit 404, and a data line driving circuit 406, as illustrated in FIG. 7 as an example.

The image data processing circuit 402 judges brightness of a plurality of display elements 302 in a display 310, based on an output signal of an image output circuit.

The scanning line driving circuit 404 individually applies voltage to the number "n" of scanning lines according to the instruction of the image data processing circuit 402.

The data line driving circuit 406 individually applies voltage to the number "m" of data lines according to the instruction of the image data processing circuit 402.

Note that, in the present embodiment, a case where the organic EL thin film layer is composed of the electron transporting layer, the light emitting layer, and the hole transporting layer, is explained, but not limited thereto. For example, the electron transporting layer and the light emitting layer may form one layer. Moreover, an electron injecting layer may be provided between the electron transporting layer and the negative electrode. Further, a hole injecting layer may be provided between the hole transporting layer and the positive electrode.

Moreover, the case of "bottom emission" where emission light is guided out from the side of the substrate is explained in the present embodiment, but not limited thereto. For example, light may be guided out from the opposite side of the substrate by using a high reflectance electrode, such as silver (Ag)-neodymium (Nd) alloy, as the positive electrode 314, and using a semi-transparent electrode (e.g., magnesium (Mg)-silver (Ag) alloy or a transparent electrode (e.g. ITO), as the negative electrode 312.

Moreover, a case where the optical control element is the organic EL element is explained in the present embodiment, but not limited thereto. For example, the optical control element may be an electrochromic element. In this case, the display 310 becomes an electrochromic display.

Figure 8:
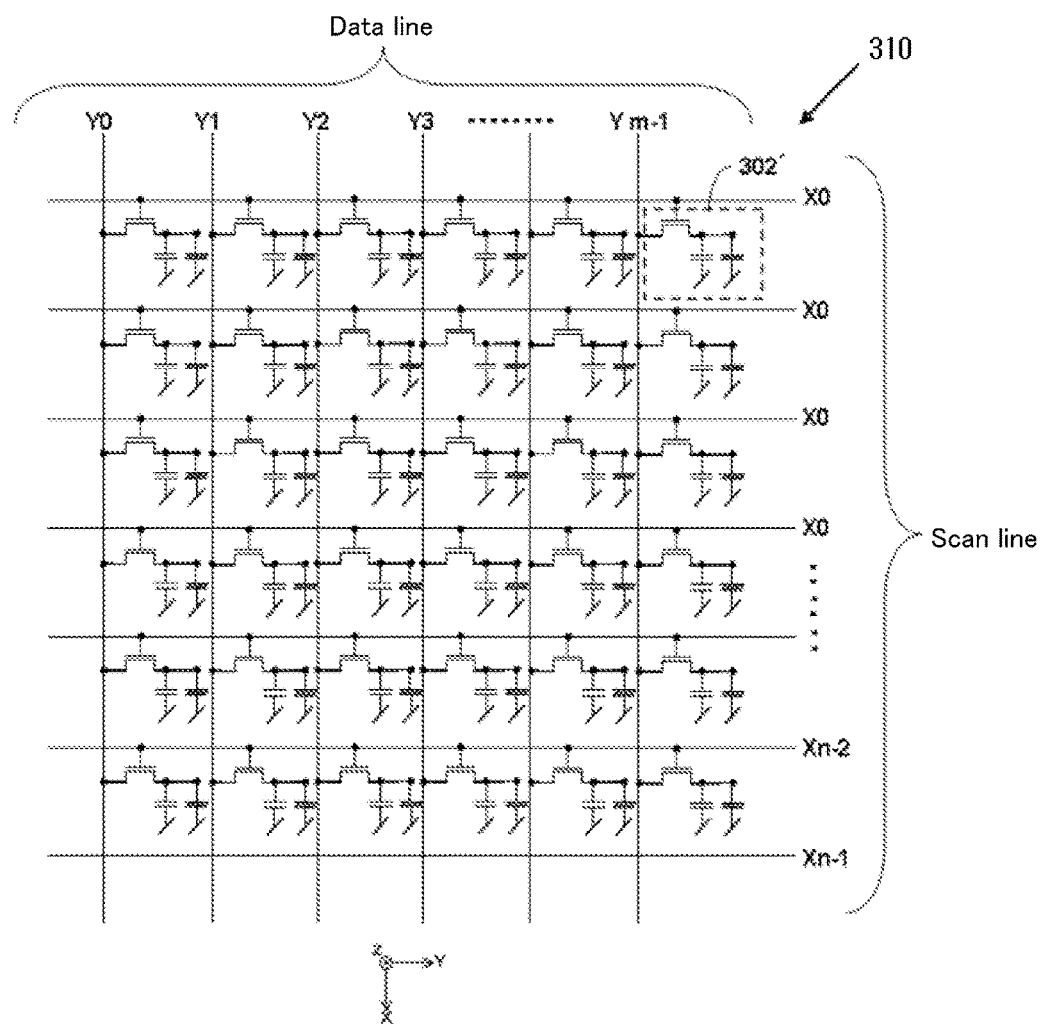
FIG. 8 is a diagram for explaining a liquid crystal display.

Moreover, the optical control element may be a liquid crystal element. In this case, the display 310 becomes a liquid crystal. As illustrated in FIG. 8 as an example, it is not necessary to provide an electric current supply line for the display element 302'.

Figure 9:
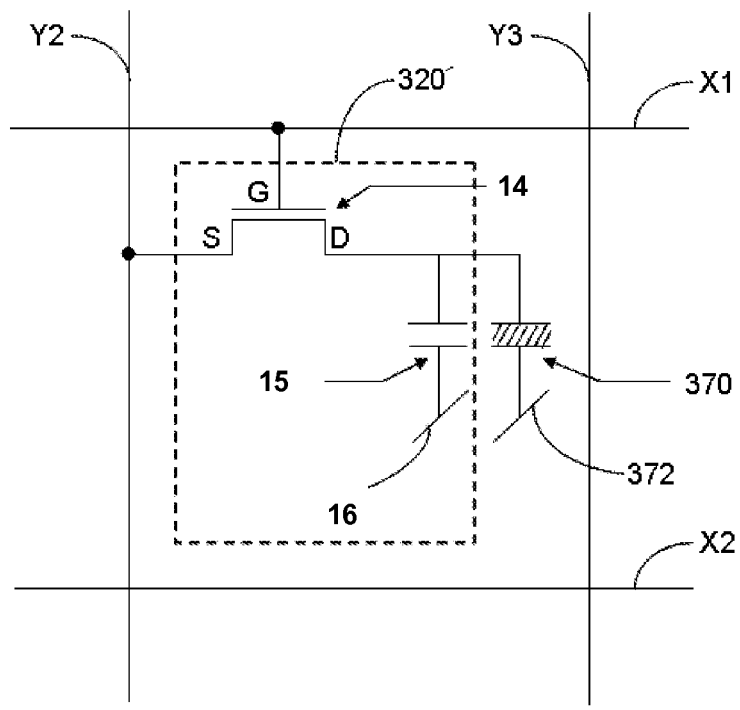
FIG. 9 is a diagram for explaining the display element in FIG. 8.

In this case, moreover, the driving circuit 320' can be composed of one field-effect transistor 14 that is similar to the aforementioned field-effect transistor (11, 12), and a capacitor 15, as illustrated in FIG. 9 as an example. In the field-effect transistor 14, the gate electrode G is connected to a certain scanning line, and the source electrode S is connected to a certain data line. Moreover, the drain electrode D is connected to a pixel electrode of the liquid crystal element 370, and to the capacitor 15. Note that, the references in FIG. 9, 16, 372 are each a counter electrode (common electrode) of the liquid crystal element 370.

In the present embodiment, the optical control element may be an electrophoretic element. Alternatively, the optical control element may be an electrowetting element.

Moreover, in the present embodiment, the case where the display is color display is explained, but not limited to such case.

Note that, the field-effect transistor according to the present embodiment can be used products (e.g., an IC card, and an ID tag) other than the display element.

Since the field-effect transistor of the present invention has high operation speed and high reliability, the same effects can be attained with the display element, image display device, and system, each using the field-effect transistor.

EXAMPLES

Examples of the present invention will be explained hereinafter, but Examples shall not be construed as to limit the scope of the present invention. In Examples below, "%" represents "% by mass" unless otherwise stated.

Examples 1 to 4

<Production of Field-Effect Transistor>
—Preparation of Coating Liquid for Forming Protective Layer—

According to the amounts depicted in Table 1, tetrabutoxy silane (T5702-100G, of Aldrich), aluminum di(s-butoxide) acetoacetic acid ester chelate (Al content: 8.4%, Alfa 89349, of Alfa Aesar), triisopropyl borate (Wako320-41532, manufactured by Wako Chemical Ltd.), a calcium 2-ethylhexanoate mineral sprits solution (Ca content: 5%, Wako 351-01162, manufactured by Wako Chemical Ltd.), and a strontium 2-ethylhexanoate toluene solution (Sr content: 2%, Wako 195-09561, manufactured by Wako Pure Chemical Industries, Ltd.) were diluted with toluene, to thereby obtain a coating liquid for forming a protective layer. The metal oxide formed by the coating liquid for forming the protective layer had the composition as depicted in Table 2.

Next, a bottom contact/bottom gate field-effect transistor, as illustrated in FIG. 3A, was produced.
—Formation of Gate Electrode—

First, a gate electrode 22 was formed on a glass substrate (substrate 21). Specifically, a Mo (molybdenum) film was formed on the glass substrate (substrate 21) by DC sputtering so that the average film thickness of the Mo (molybdenum) film was to be about 100 nm. Thereafter, a photoresist was applied on the Mo film, and the photoresist was then subjected to pre-baking, light exposure by an exposure device, and developing, to thereby form a resist pattern, which was identical to a pattern of the gate electrode 22 to be formed. Then, the region of the Mo film, on which the resist pattern had not been formed, was removed by reactive ion etching (RIE). Thereafter, the remained resist pattern was removed, to thereby form the gate electrode 22 formed of the Mo film.
—Formation of Gate Insulating Layer—

Next, a gate insulating layer 23 was formed on the gate electrode 22. Specifically, an $Al_2O_3$ film was formed on the gate electrode 22 and the glass substrate (substrate 21) by RF sputtering so that the average film thickness of the $Al_2O_3$ film was to be about 300 nm, to thereby form the gate insulating layer 23.

—Formation of Source Electrode and Drain Electrode—

Next, a source electrode 24 and a drain electrode 25 were formed on the gate insulating layer 23. Specifically, a Mo (molybdenum) film was formed on the gate insulating layer 23 by DC sputtering so that the average film thickness of the Mo film was to be about 100 nm. Thereafter, a photoresist was applied on the Mo film, and the photoresist was then subjected to pre-baking, light exposure by an exposure device, and developing, to thereby form a resist pattern, which was identical to a pattern of the source electrode 24 and drain electrode 25 to be formed. Then the region of the Mo film, on which the resist pattern had not been formed, was removed. Thereafter, the remaining resist pattern was removed, to thereby form the source electrode 24 and the drain electrode 25, each of which was formed of the Mo film.

—Formation of Oxide Semiconductor Layer—

Next, an oxide semiconductor layer 26 was formed. Specifically, a Mg—In oxide ($In_2MgO_4$) film was formed by DC sputtering so that the average film thickness was to be about 100 nm. Thereafter, a photoresist was applied on the Mg—In oxide film, and the photoresist was then subjected to pre-baking, light exposure by an exposure device, and developing, to thereby form a resist pattern, which was identical to a pattern of the oxide semiconductor layer 26 to be formed. The region of the Mg—In oxide film, on which the resist pattern had not been formed, was removed by wet etching. Thereafter, the resist pattern was removed, to thereby form the oxide semiconductor layer 26. As a result, the oxide semiconductor layer 26 was formed so that a channel was formed between the source electrode 24 and the drain electrode 25.

—Formation of Protective Layer—

Next, 0.4 mL of the coating liquid for forming the protective layer was applied onto the substrate drop wise, and the applied coating liquid was spin coated under certain conditions (after rotating at 300 rpm for 5 seconds, rotating at 3,000 rpm for 20 second, followed by stopping the rotation to 0 rpm for 5 seconds). Subsequently, the applied coating liquid was dried in the atmosphere at 120° C. for 1 hour, followed by baking in the O2 atmosphere at 400° C. for 3 hours, to thereby form a $SiO_2$-$A_2O_3$—$B_2O_3$—CaO—SrO metal oxide composite insulating film (protective layer), as the protective layer 27. In this manner, the field-effect transistor was completed.

The average film thickness of the protective layer 27 was about 30 nm.

Finally, as for a heat processing of a post treatment, the heat processing was performed at 320° C. for 30 minutes, followed by subjecting the protective layer 27 of the field-effect transistor to evaluation of an appearance. The result is presented in Table 2.

<Production of Capacitor for Measuring Dielectric Constant>

Figure 10:
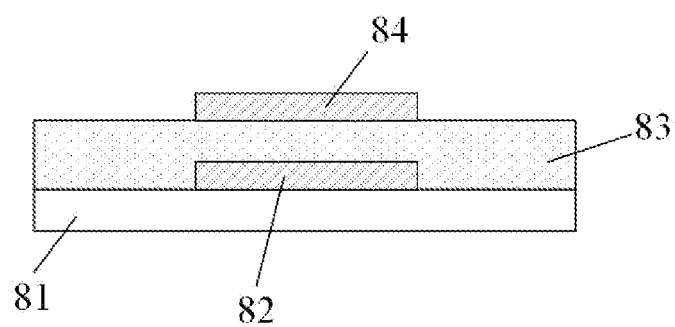
FIG. 10 is a schematic structure diagram of a capacitor for measuring dielectric constant.

A capacitor having the structure illustrated in FIG. 10 was produced. First, a lower electrode 82 was formed on a glass substrate 81. Specifically, a Mo (molybdenum) film was formed through a metal mask by DC sputtering so that the average film thickness thereof was to be about 100 nm. Next, a dielectric layer 83 was formed in the same process to that of the formation of the protective layer of the field-effect transistor of each Example. Finally, an upper electrode 84 was formed on the dielectric layer 83 with the same material and in the same process to those of the lower electrode 82, to thereby produce the capacitor. The average film thickness of the dielectric layer 83 was 30 nm. The dielectric constant of the produced capacitor was measured by means of a LCR meter (4284A, of Agilent). The results are presented in Table 2.

<Production of Sample for Measuring Linear Expansion Coefficient>

The coating liquid for forming the protective layer (1 L) of each Example was prepared, followed by removing the solvent. The resultant was placed in a platinum crucible, and was heated and melted at 1,600° C., followed by producing a cylindrical object having a diameter of 5 mm and height of 10 mm by a float process. The produced cylindrical object was subjected to the measurement of the average liner expansion coefficient in the temperature range of 20° C. to 300° C. by means of a thermomechanical analysis device (8310 series, manufactured by Rigaku Corporation). The produced cylindrical object had the same composition to that of the protective layer of the field-effect transistor of each Example, and therefore would have the same linear expansion coefficient to that of the protective layer of the field-effect transistor of each Example.

TABLE 1

|  | Mass/g | | | |
| --- | --- | --- | --- | --- |
|  | Ex. 1 | Ex. 2 | Ex. 3 | Ex. 4 |
| tetrabutoxy silane | 1.68 | 1.74 | 1.50 | 1.75 |
| aluminum di(s-butoxide)acetoacetic acid ester chelate | 0.52 | 0.57 | 0.42 | 0.69 |
| triisopropyl borate | 0.34 | 0.36 | 0.32 | 0.39 |
| calcium 2-ethylhexanoate mineral spirits solution (Ca content: 5%) | 0.45 | 0.23 | 0.28 | 0.05 |
| strontium 2-ethylhexanoate toluene solution (Sr content: 2%) | 0.86 | 0.66 | 5.04 | 0.40 |
| toluene | 5.37 | 5.78 | 1.44 | 6.33 |

TABLE 2

|  | Ex. 1 | | Ex. 2 | | Ex. 3 | | Ex. 4 | |
| --- | --- | --- | --- | --- | --- | --- | --- | --- |
|  | Oxide mass ratio | Oxide molar ratio | Oxide mass ratio | Oxide molar ratio | Oxide mass ratio | Oxide molar ratio | Oxide mass ratio | Oxide molar ratio |
| Oxide | mass % | mol % | mass % | mol % | mass % | mol % | mass % | mol % |
| $SiO_2$ | 61.0 | 67.5 | 62.8 | 70.0 | 50.9 | 60.3 | 62.3 | 70.3 |
| $Al_2O_3$ | 16.4 | 10.7 | 18.1 | 11.9 | 12.3 | 8.6 | 21.5 | 14.3 |
| $B_2O_3$ | 12.3 | 11.8 | 12.8 | 12.3 | 10.8 | 11.1 | 13.7 | 13.4 |
| MgO | — | — | — | — | — | — | — | — |
| CaO | 6.2 | 7.4 | 3.2 | 3.8 | 3.7 | 4.7 | 0.7 | 0.8 |

TABLE 2-continued

| Oxide | Ex. 1 | | Ex. 2 | | Ex. 3 | | Ex. 4 | |
|---|---|---|---|---|---|---|---|---|
| | Oxide mass ratio mass % | Oxide molar ratio mol % | Oxide mass ratio mass % | Oxide molar ratio mol % | Oxide mass ratio mass % | Oxide molar ratio mol % | Oxide mass ratio mass % | Oxide molar ratio mol % |
| SrO | 4.0 | 2.6 | 3.1 | 2.0 | 22.3 | 15.3 | 1.8 | 1.2 |
| BaO | — | — | — | — | — | — | — | — |
| total | 100.0 | 100.0 | 100.0 | 100.0 | 100.0 | 100.0 | 100.0 | 100.0 |
| Dielectric constant | 5.5 | | 5.0 | | 6.0 | | 4.8 | |
| Linear expansion coefficient ($\times 10^{-7}/K^{-1}$) | 36.4 | | 30.0 | | 50.3 | | 24.7 | |
| Appearance | No pealing | | No pealing | | No pealing | | No pealing | |

In Table 2, "—" denotes that the ratio is 0%, which is the same in Tables 4, 6, 8, 11, 12, 13, and 15.

Examples 5 to 7

According to the amounts depicted in Table 3, 1,1,1,3,3,3-hexamethyl disilazane (HMDS, manufactured by Tokyo Ohka Kogyo Co., Ltd.), aluminum di(s-butoxide)acetoacetic acid ester chelate (Al content: 8.4%, Alfa 89349, of Alfa Aesar), phenyl borate (Wako 163-23222, manufactured by Wako Pure Chemical Industries, Ltd.), a magnesium 2-ethylhexanoate toluene solution (Mg content: 3%, Stream 12-1260, manufactured by Strem Chemicals, Inc.), a calcium 2-ethylhexanoate mineral sprits solution (Ca content: 5%, Wako 351-01162, manufactured by Wako Chemical Ltd.), a strontium 2-ethylhexanoate toluene solution (Sr content: 2%, Wako 195-09561, manufactured by Wako Pure Chemical Industries, Ltd.), and a barium 2-ethylhexanoate toluene solution (Ba content: 8%, Wako 021-09471, manufactured by Wako Pure Chemical Industries, Ltd.) were diluted with toluene, to thereby obtain a coating liquid for forming a protective layer. The metal oxide formed by the coating liquid for forming the protective layer had the composition as depicted in Table 4.

A field-effect transistor, a capacitor, and a cylindrical object were produced using the prepared coating liquid for forming the protective layer in the same manners as in Example 1, and were evaluated in the same manners as in Example 1. The results are presented in Table 4.

TABLE 3

| | Mass/g | | |
|---|---|---|---|
| | Ex. 5 | Ex. 6 | Ex. 7 |
| HMDS | 0.41 | 0.41 | 0.41 |
| aluminum di(s-butoxide)acetoacetic acid ester chelate | 0.52 | 0.52 | 0.52 |
| phenyl borate | 0.23 | 0.23 | 0.23 |
| magnesium 2-ethylhexanoate toluene solution (Mg content: 3%) | 0.45 | — | — |
| calcium 2-ethylhexanoate mineral sprits solution (Ca content: 5%) | 0.16 | — | — |
| strontium 2-ethylhexanoate toluene solution (Sr content: 2%) | — | 2.44 | 3.29 |
| barium 2-ethylhexanoate toluene solution (Ba content: 8%) | — | 0.34 | — |
| toluene | 4.91 | 2.92 | 3.15 |

TABLE 4

| Oxide | Ex. 5 | | Ex. 6 | | Ex. 7 | |
|---|---|---|---|---|---|---|
| | Oxide mass ratio mass % | Oxide molar ratio mol % | Oxide mass ratio mass % | Oxide molar ratio mol % | Oxide mass ratio mass % | Oxide molar ratio mol % |
| $SiO_2$ | 63.3 | 67.5 | 56.9 | 67.5 | 57.9 | 67.5 |
| $Al_2O_3$ | 17.0 | 10.7 | 15.3 | 10.7 | 15.6 | 10.7 |
| $B_2O_3$ | 12.8 | 11.8 | 11.5 | 11.8 | 11.7 | 11.8 |
| MgO | 4.6 | 7.4 | — | — | — | — |
| CaO | 2.3 | 2.6 | — | — | — | — |
| SrO | — | — | 10.7 | 7.4 | 14.8 | 10.0 |
| BaO | — | — | 5.6 | 2.6 | — | — |
| Total | 100.0 | 100.0 | 100.0 | 100.0 | 100.0 | 100.0 |
| Dielectric constant | 5.0 | | 5.8 | | 6.0 | |
| Linear expansion coefficient ($\times 10^{-7}/K^{-1}$) | 30.8 | | 39.5 | | 38.6 | |
| Appearance | No pealing | | No pealing | | No pealing | |

Examples 8 and 9

According to the amounts depicted in Table 5, 1,1,1,3,3,3-hexamethyl disilazane (HMDS, manufactured by Tokyo Ohka Kogyo Co., Ltd.), aluminum di(s-butoxide)acetoacetic acid ester chelate (Al content: 8.4%, Alfa 89349, of Alfa Aesar), a magnesium 2-ethylhexanoate toluene solution (Mg content: 3%, Stream 12-1260, manufactured by Strem Chemicals, Inc.), and a strontium 2-ethylhexanoate toluene solution (Sr content: 2%, Wako 195-09561, manufactured by Wako Pure Chemical Industries, Ltd.) were diluted with toluene, to thereby prepare a coating liquid for forming a protective layer. The metal oxide formed by the coating liquid for forming the protective layer had the composition as depicted in Table 6.

A field-effect transistor, a capacitor, and a cylindrical object were produced using the prepared coating liquid for forming the protective layer in the same manners as in Example 1, and were evaluated in the same manners as in Example 1. The results are presented in Table 6.

TABLE 5

| | Mass/g | |
|---|---|---|
| | Ex. 8 | Ex. 9 |
| HMDS | 0.44 | 0.44 |
| aluminum di(s-butoxide) acetoacetic acid ester chelate | 0.86 | 0.86 |
| magnesium 2-ethylhexanoate toluene solution(Mg content: 3%) | 0.26 | — |
| strontium 2-ethylhexanoate toluene solution (Sr content: 2%) | 1.91 | 3.29 |
| toluene | 2.25 | 0.81 |

TABLE 6

| | Ex. 8 | | Ex. 9 | |
|---|---|---|---|---|
| | Oxide mass ratio mass % | Oxide molar ratio mol % | Oxide mass ratio mass % | Oxide molar ratio mol % |
| Oxide | | | | |
| $SiO_2$ | 62.5 | 72.1 | 60.2 | 72.1 |
| $Al_2O_3$ | 26.3 | 17.9 | 25.4 | 17.9 |
| $B_2O_3$ | — | — | — | — |
| MgO | 2.4 | 4.2 | — | — |
| CaO | — | — | — | — |
| SrO | 8.7 | 5.8 | 14.4 | 10.0 |
| BaO | — | — | — | — |
| Total | 100.0 | 100.0 | 100.0 | 100.0 |
| Dielectric constant | 5.9 | | 6.0 | |
| Linear expansion coefficient ($\times 1E^{-7}/K^{-1}$) | 30.2 | | 34.4 | |
| Appearance | No pealing | | No pealing | |

Examples 10 and 11

According to the amounts depicted in Table 7, 1,1,1,3,3,3-hexamethyl disilazane (HMDS, manufactured by Tokyo Ohka Kogyo Co., Ltd.), 2-isopropoxy-4,4,5,5-tetramethyl-1,3,2-dioxadioxaborolane (Wako 325-41462, manufactured by Wako Chemical Ltd.), a calcium 2-ethylhexanoate mineral spirits solution (Ca content: 5%, Wako 351-01162, manufactured by Wako Chemical Ltd.), and a barium 2-ethylhexanoate toluene solution (Ba content: 8%, Wako 021-09471, manufactured by Wako Pure Chemical Industries, Ltd.) were diluted with toluene, to thereby prepare a coating liquid for forming a protective layer. The metal oxide formed by the coating liquid for forming the protective layer had the composition as depicted in Table 8.

A field-effect transistor, a capacitor, and a cylindrical object were produced using the prepared coating liquid for forming the protective layer in the same manners as in Example 1, and were evaluated in the same manners as in Example 1. The results are presented in Table 8.

TABLE 7

| | Mass/g | |
|---|---|---|
| | Ex. 10 | Ex. 11 |
| HMDS | 0.43 | 0.43 |
| 2-isopropoxy-4,4,5,5-tetramethyl-1,3,2-dioxaborolane | 0.57 | 0.57 |
| calcium 2-ethylhexanoate mineral spirits solution (Ca content: 5%) | 0.40 | — |

TABLE 7-continued

| | Mass/g | |
|---|---|---|
| | Ex. 10 | Ex. 11 |
| barium 2-ethylhexanoate toluene solution (Ba content: 8%) | 0.43 | 1.29 |
| toluene | 4.23 | 3.26 |

TABLE 8

| | Ex. 10 | | Ex. 11 | |
|---|---|---|---|---|
| | Oxide mass ratio mass % | Oxide molar ratio mol % | Oxide mass ratio mass % | Oxide molar ratio mol % |
| Oxide | | | | |
| $SiO_2$ | 65.7 | 70.8 | 59.7 | 70.8 |
| $Al_2O_3$ | — | — | — | — |
| $B_2O_3$ | 20.6 | 19.2 | 18.8 | 19.2 |
| MgO | — | — | — | — |
| CaO | 5.8 | 6.7 | — | — |
| SrO | — | — | — | — |
| BaO | 7.8 | 3.3 | 21.5 | 10.0 |
| Total | 100.0 | 100.0 | 100.0 | 100.0 |
| Dielectric constant | 4.7 | | 4.4 | |
| Linear expansion coefficient ($\times 10^{-7}/K^{-1}$) | 33.7 | | 43.0 | |
| Appearance | No pealing | | No pealing | |

Examples 12 to 18

According to the amounts depicted in Tables 9 and 10, tetrabutoxy silane (T5702-100 G, of Aldrich), a magnesium 2-ethylhexanoate toluene solution (Mg content: 3%, Stream 12-1260, manufactured by Strem Chemicals, Inc.), a calcium 2-ethylhexanoate mineral spirits solution (Ca content: 5%, Wako 351-01162, manufactured by Wako Chemical Ltd.), a strontium 2-ethylhexanoate toluene solution (Sr content: 2%, Wako 195-09561, manufactured by Wako Pure Chemical Industries, Ltd.), and a barium 2-ethylhexanoate toluene solution (Ba content: 8%, Wako 021-09471, manufactured by Wako Pure Chemical Industries, Ltd.) were diluted with toluene, to thereby prepare a coating liquid for forming a protective layer. The metal oxide formed by the coating liquid for forming the protective layer had the composition as depicted in Tables 11 and 12.

A field-effect transistor, a capacitor, and a cylindrical object were produced using the prepared coating liquid for forming the protective layer in the same manners as in Example 1, and were evaluated in the same manners as in Example 1. The results are presented in Tables 11 and 12.

TABLE 9

| | Mass/g | | | |
|---|---|---|---|---|
| | Ex. 12 | Ex. 13 | Ex. 14 | Ex. 15 |
| tetrabutoxy silane | 2.24 | 1.99 | 1.74 | 1.61 |
| Magnesium 2-ethylhexanoate toluene solution(Mg content: 3%) | 0.26 | 0.62 | 1.05 | 1.05 |
| calcium 2-ethylhexanoate mineral spirits solution (Ca content: 5%) | — | — | — | — |

TABLE 9-continued

| | Mass/g | | | |
|---|---|---|---|---|
| | Ex. 12 | Ex. 13 | Ex. 14 | Ex. 15 |
| strontium 2-ethylhexanoate toluene solution (Sr content: 2%) | 1.91 | 3.23 | 4.22 | 5.83 |
| barium 2-ethylhexanoate toluene solution(Ba content: 8%) | — | — | — | — |
| toluene | 3.12 | 1.68 | 0.52 | — |

TABLE 10

| | Mass/g | | |
|---|---|---|---|
| | Ex. 16 | Ex. 17 | Ex. 18 |
| tetrabutoxy silane | 1.99 | 1.99 | 1.99 |
| magnesium 2-ethylhexanoate toluene solution (Mg content: 3%) | 0.89 | — | — |
| calcium 2-ethylhexanoate mineral spirits solution (Ca content: 5%) | — | 0.70 | 1.21 |
| strontium 2-ethylhexanoate toluene solution (Sr content: 2%) | — | 2.77 | — |
| barium 2-ethylhexanoate toluene solution (Ba content: 8%) | 0.70 | — | — |
| toluene | 3.94 | 2.06 | 4.32 |

TABLE 11

| | Ex. 12 | | Ex. 13 | | Ex. 14 | | Ex. 15 | |
|---|---|---|---|---|---|---|---|---|
| | Oxide mass ratio | Oxide molar ratio | Oxide mass ratio | Oxide molar ratio | Oxide mass ratio | Oxide molar ratio | Oxide mass ratio | Oxide molar ratio |
| Oxide | mass % | mol % | mass % | mol % | mass % | mol % | mass % | mol % |
| $SiO_2$ | 87.5 | 90.0 | 77.1 | 80.0 | 67.6 | 70.0 | 60.7 | 65.0 |
| $Al_2O_3$ | — | — | — | — | — | — | — | — |
| $B_2O_3$ | — | — | — | — | — | — | — | — |
| MgO | 2.7 | 4.2 | 6.6 | 10.2 | 11.1 | 17.2 | 10.8 | 17.3 |
| CaO | — | — | — | — | — | — | — | — |
| SrO | 9.7 | 5.8 | 16.3 | 9.8 | 21.3 | 12.8 | 28.5 | 17.7 |
| BaO | — | — | — | — | — | — | — | — |
| Total | 100.0 | 100.0 | 100.0 | 100.0 | 100.0 | 100.0 | 100.0 | 100.0 |
| Dielectric constant | 4.6 | | 5.2 | | 5.5 | | 6.2 | |
| Linear expansion coefficient ($\times 10^{-7}/K^{-1}$) | 30.2 | | 41.8 | | 55.3 | | 63.4 | |
| Appearance | No pealing | | No pealing | | No pealing | | No pealing | |

TABLE 12

| | Ex. 16 | | Ex. 17 | | Ex. 18 | |
|---|---|---|---|---|---|---|
| | Oxide mass ratio | Oxide molar ratio | Oxide mass ratio | Oxide molar ratio | Oxide mass ratio | Oxide molar ratio |
| Oxide | mass % | mol % | mass % | mol % | mass % | mol % |
| $SiO_2$ | 77.2 | 80.0 | 76.0 | 80.0 | 81.1 | 80.0 |
| $Al_2O_3$ | — | — | — | — | — | — |
| $B_2O_3$ | — | — | — | — | — | — |
| MgO | 9.5 | 14.6 | — | — | — | — |
| CaO | — | — | 10.3 | 11.6 | 18.9 | 20.0 |

TABLE 12-continued

| | Ex. 16 | | Ex. 17 | | Ex. 18 | |
|---|---|---|---|---|---|---|
| | Oxide mass ratio | Oxide molar ratio | Oxide mass ratio | Oxide molar ratio | Oxide mass ratio | Oxide molar ratio |
| Oxide | mass % | mol % | mass % | mol % | mass % | mol % |
| SrO | — | — | 13.8 | 8.4 | — | — |
| BaO | 13.3 | 5.4 | — | — | — | — |
| Total | 100.0 | 100.0 | 100.0 | 100.0 | 100.0 | 100.0 |
| Dielectric constant | 5.4 | | 5.7 | | 5.8 | |
| Linear expansion coefficient ($\times 10^{-7}/K^{-1}$) | 39.6 | | 34.4 | | 46.0 | |
| Appearance | No pealing | | No pealing | | No pealing | |

Comparative Example 1

<Production of Field-Effect Transistor>

First, a gate electrode, a gate insulating layer, a source electrode and a drain electrode, and an oxide semiconductor layer were formed on a glass substrate in the same manners as in Example 1.

—Formation of Protective Layer—

Next, a protective layer was formed. Specifically, 0.4 mL of a fluororesin coating liquid (Cytop CTL-809A, manufactured by ASAHI GLASS CO., LTD.) was applied by spin coating (rotated at 500 rpm for 10 seconds, followed by rotated at 2,000 rpm for 30 seconds). Next, the applied coating liquid was prebaked at 90° C. for 30 minutes, followed by postbaking at 230° C. for 60 minutes, to thereby form the protective layer to cover the oxide semiconductor layer. The protective layer formed in this manner had the average film thickness of about 1,500 nm.

Finally, as for a heat processing of a post treatment, the heat processing was performed at 320° C. for 30 minutes, followed by subjecting the protective layer 27 of the field-effect transistor to evaluation of an appearance. The result is presented in Table 13.

<Production of Capacitor for Measuring Dielectric Constant>

A capacitor having the structure illustrated in FIG. 10 was produced. First, a lower electrode 82 was formed on a glass substrate 81. Specifically, a Mo (molybdenum) film was formed through a metal mask by DC sputtering so that the average film thickness thereof was to be about 100 nm. Next, a dielectric layer 83 was formed in the same process to that of the formation of the protective layer of the field-effect transistor of Comparative Example 1. Finally, an upper electrode 84 was formed on the dielectric layer 83 with the same material and in the same process to those of the lower electrode 82, to thereby produce the capacitor. The average film thickness of the dielectric layer 83 was 1,500 nm. The dielectric constant of the produced capacitor was measured by means of a LCR meter (4284A, of Agilent). The result is presented in Table 13.

<Production of Sample for Measuring Linear Expansion Coefficient>

First, a fluororesin coating liquid (Cytop CTL-809A, manufactured by ASAHI GLASS CO., LTD.) was diluted to 2-fold with a fluorine-based solvent (CT-SOLV180, manufactured by ASAHI GLASS CO., LTD.), to thereby prepare a coating liquid. Next, 0.4 mL of the coating liquid was applied on a monocrystal Si substrate by spin coating (rotated at 500 rpm for 10 seconds, followed by rotated at 1,000 rpm for 30 seconds). Subsequently, the applied coating liquid was prebaked at 90° C. for 30 minutes, followed by post baking at 230° C. for 60 minutes, to thereby prepare a sample for measuring linear expansion coefficient. The average film thickness of the sample was 300 nm. The produced sample for measuring linear expansion coefficient was subjected to the measurement of the average linear expansion coefficient in the temperature range of 20° C. to 80° C. by X-ray reflectometry. The result is presented in Table 13.

Comparative Example 2

<Production of Field-Effect Transistor>

First, a gate electrode, a gate insulating layer, a source electrode and a drain electrode, and an oxide semiconductor layer were formed on a glass substrate in the same manner as in Example 1.

—Formation of Protective Layer—

Next, a protective layer was formed. Specifically, a $SiO_2$ layer was formed as a protective layer using $SiCl_4$ as a raw material by plasma enhanced chemical vapor deposition (PECVD), to complete a field-effect transistor. The protective layer formed in this manner had the average film thickness of about 30 nm.

Finally, as for a heat processing of a post treatment, the heat processing was performed at 320° C. for 30 minutes, followed by subjecting the protective layer 27 of the field-effect transistor to evaluation of an appearance. The result is presented in Table 13.

<Production of Capacitor for Measuring Dielectric Constant>

A capacitor having the structure illustrated in FIG. 10 was produced. First, a lower electrode 82 was formed on a glass substrate 81. Specifically, a Mo (molybdenum) film was formed through a metal mask by DC sputtering so that the average film thickness thereof was to be about 100 nm. Next, a dielectric layer 83 was formed in the same process to that of the formation of the protective layer of the field-effect transistor of Comparative Example 2. Finally, an upper electrode 84 was formed on the dielectric layer 83 with the same material and in the same process to those of the lower electrode 82, to thereby produce the capacitor. The average film thickness of the dielectric layer 83 was 30 nm. The dielectric constant of the produced capacitor was measured by means of a LCR meter (4284A, of Agilent). The results are presented in Table 13.

<Production of Sample for Measuring Linear Expansion Coefficient>

$SiCl_4$ was used as a raw material. The silica powder was grown through hydrolysis performed in oxygen-hydrogen flame to thereby obtain a $SiO_2$ porous material. The $SiO_2$ porous material was melted at high temperature of 1,600° C., to thereby prepare cylindrical $SiO_2$ glass having a diameter of 5 mm, and height of 10 mm. The produced cylindrical glass was subjected to the measurement of the average linear expansion coefficient in the temperature range of 20° C. to 300° C. by means of a thermomechanical analysis device (8310 series, manufactured by Rigaku Corporation). The produced cylindrical glass had the same composition to that of the protective layer of the field-effect transistor of Comparative Example 2, and therefore would have the same linear expansion coefficient to that of the protective layer of the field-effect transistor of Comparative Example 2.

TABLE 13

|  | Comp. Ex. 1 | Comp. Ex. 2 Oxide mass ratio mass % | Comp. Ex. 2 Oxide molar ratio mol % |
|---|---|---|---|
| Oxide |  |  |  |
| $SiO_2$ | Foluororesin | 100 | 100 |
| $Al_2O_3$ |  | — | — |
| $B_2O_3$ |  | — | — |
| MgO |  | — | — |
| CaO |  | — | — |
| SrO |  | — | — |
| BaO |  | — | — |
| Total |  | 100 | 100 |
| Dielectric constant | 2.1 | 3.9 |  |
| Linear expansion coefficient ($\times 10^{-1}/K^{-1}$) | 1200.0 | 5.0 |  |
| Appearance | No pealing | Pealed |  |

Comparative Examples 3 and 4

According to the amounts depicted in Table 14, tetrabutoxy silane (T5702-100 G, of Aldrich), aluminum di(s-butoxide)acetoacetic acid ester chelate (Al content: 8.4%, Alfa 89349, of Alfa Aesar), and 2-isopropoxy-4,4,5,5-tetramethyl-1,3,2-dioxaborolane (Wako 325-41462, manufactured by Wako Chemical Ltd.) were diluted with toluene, to thereby obtain a coating liquid for forming a protective layer. The metal oxide formed by the coating liquid for forming the protective layer had the composition as depicted in Table 15.

A field-effect transistor, a capacitor, and a cylindrical object were produced using the prepared coating liquid for forming the protective layer in the same manners as in Example 1, and were evaluated in the same manners as in Example 1. The results are presented in Table 15.

TABLE 14

| | Mass/g | |
|---|---|---|
| | Comp. Ex. 3 | Comp. Ex. 4 |
| tetrabutoxy silane | 2.08 | 2.10 |
| aluminum di(s-butoxide)acetoacetic acid ester chelate | 0.78 | — |
| 2-isopropoxy-4,4,5,5-tetramethyl-1,3,2-dioxaborolane | — | 0.46 |
| toluene | 5.87 | 6.14 |

TABLE 15

| | Comp. Ex. 3 | | Comp. Ex. 4 | |
|---|---|---|---|---|
| | Oxide mass ratio mass % | Oxide molar ratio mol % | Oxide mass ratio mass % | Oxide molar ratio mol % |
| Oxide | | | | |
| $SiO_2$ | 75.3 | 83.8 | 82.4 | 84.4 |
| $Al_2O_3$ | 24.7 | 16.2 | — | — |
| $B_2O_3$ | — | — | 17.6 | 15.6 |
| MgO | — | — | — | — |
| CaO | — | — | — | — |
| SrO | — | — | — | — |
| BaO | — | — | — | — |
| Total | 100.0 | 100.0 | 100.0 | 100.0 |
| Dielectric constant | 5.1 | | 3.6 | |
| Linear expansion coefficient ($\times 10^{-7}/K^{-1}$) | 12.9 | | 17.4 | |
| Appearance | Pealed | | Pealed | |

<Appearance of Field-Effect Transistor, and Dielectric Constant and Linear Expansion Coefficient of Protective Layer>

It was confirmed that the protective layers of the field-effect transistors of Comparative Examples 2 to 4 were pealed in the position above the source electrode 24 and the drain electrode 25, each formed of the Mo film, or above the oxide semiconductor layer 26 formed of the Mg—In oxide ($In_2MgO_4$) film.

This is probably because stress was caused at the interface between the Mo film or Mg—In oxide film and the protective layer, as the linear expansion coefficient of the protective layer of each field-effect transistor of Comparative Examples 2 to 4 was small, i.e., $5\times10^{-7}$ to $20\times10^{-7}$, compared to the linear expansion coefficient of the Mo film or Mg—In oxide ($In_2MgO_4$) film, which was about $30\times10^{-7}$.

Compared to the above, the protective layers of the field-effect transistors of Examples 1 to 18 had the dielectric constant of 7.0 or lower due to the composition thereof, but had the linear expansion coefficient of $30.0\times10^{-7}$ or greater, and had no pealing and exhibited excellent results. Especially, the protective layers of the field-effect transistors of Examples 1 to 3, 5 to 14, and 16 to 18 had the dielectric constant of 6.0 or lower, and the linear expansion coefficient of $30.0\times10^{-7}$ to $60.0\times10^{-7}$, and exhibited more excellent results.

Moreover, no pealing was observed on the protective layer of the field-effect transistor produced in Comparative Example 1.

<Evaluation of Reliability of Properties of Transistor>

A DC bias stress test was performed in the N2 atmosphere on each of the field-effect transistors produced in Examples 1 to 18, and Comparative Example 1 for 160 hours.

Specifically, two types of the stress conditions were provided.

(1) Conditions including voltage between the gate electrode 22 and the source electrode 24 (Vgs) being +20 V (Vgs=+20 V), and the voltage between the drain electrode 25 and the source electrode 24 (Vds) being 0 V (Vds=0 V)

(2) Conditions including Vgs=Vds=+20 V

Figure 11:
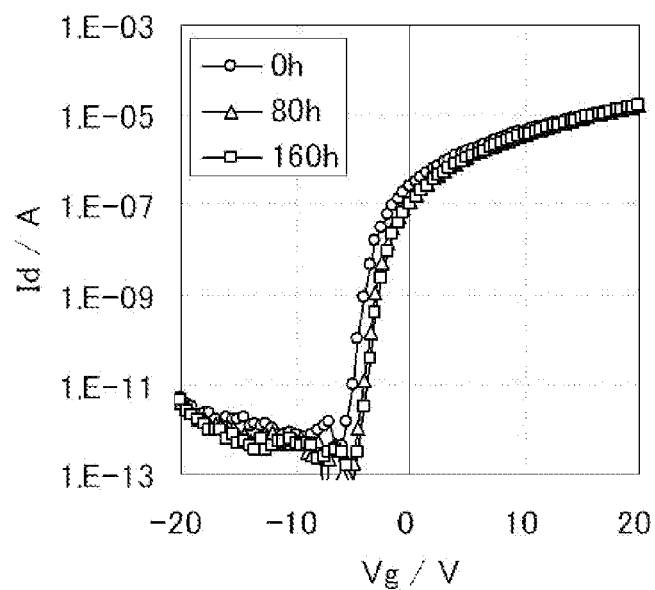
FIG. 11 is a graph for evaluating the properties of the field-effect transistor obtained in Example 1.
Figure 12:
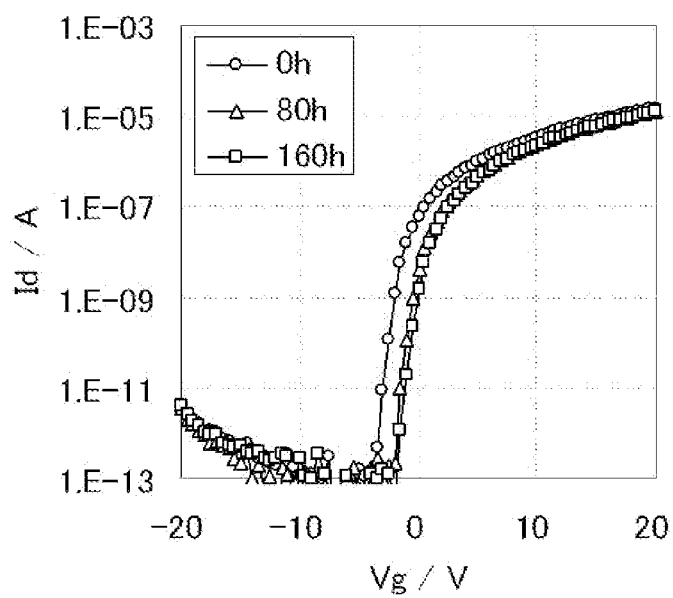
FIG. 12 is a graph for evaluating the properties of the field-effect transistor obtained in Example 1.

The result of the field-effect transistor produced in Example 1 with the stress conditions of Vgs=+20, and Vds=0V is presented in FIG. 11, and the result thereof with the stress condition of Vgs=Vds=+20 is presented in FIG. 12. Moreover, the result of the field-effect transistor produced in Comparative Example 1 with the stress conditions of Vgs=+20, and Vds=0V is presented in FIG. 13, and the result thereof with the stress condition of Vgs=Vds=+20 is presented in FIG. 14. In the graphs of FIGS. 11 to 14, "E" on the vertical axis represents exponent of 10. For example, "1.E-03" represents "$1\times10^{-3}$" and "0.001," and "1.E-05" represents "$1\times10^{-5}$" and "0.00001."

The onset voltage (Von) of the transistor properties was determined as the voltage that was just below the voltage at which Ids exceeded $10^{-11}$ A in the course of increasing the Vg from −20 V stepwise by 0.5 V.

Figure 13:
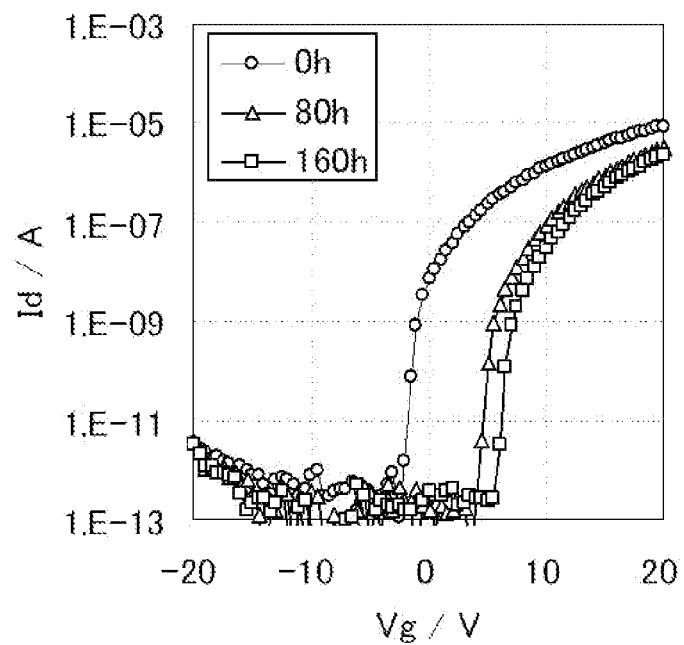
FIG. 13 is a graph for evaluating the properties of the field-effect transistor obtained in Comparative Example 1.
Figure 14:
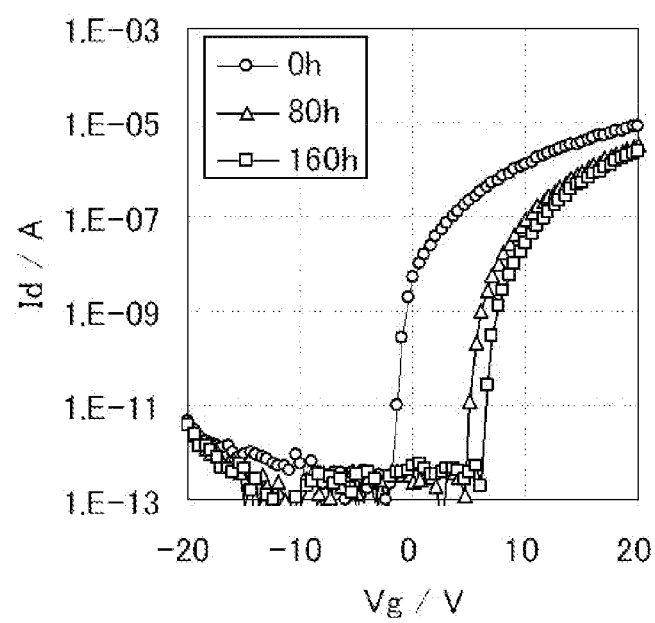
FIG. 14 is a graph for evaluating the properties of the field-effect transistor obtained in Comparative Example 1.

Paying attention to the sift amount ΔVon of the onset voltage Von during the stress test of 160 hours, the sift amount ΔVon was +8.0 V in the graph of FIG. 13 and that was +7.5 V was in the graph of FIG. 14, whereas the sift amount ΔVon was +1.0 V in FIG. 11, and that was +1.5 V in FIG. 12. The results of ΔVon from the stress test of 160 hours performed on the field-effect transistors produced in Examples 1 to 16, and Comparative Example 1 are presented in Table 16. It was confirmed from Table 16 that there was predominant difference between Examples 1 to 18 and Comparative Example 1. Specifically, it was found that the protective layers of the field-effect transistors produced in Examples 1 to 18 were more suitable as a protective layer of a semiconductor layer (specially an oxide semiconductor layer) than that of the field-effect transistor produced in Comparative Example 1.

Moreover, the field-effect transistors produced in Examples 1 to 18 exhibited excellent reliability even in the atmosphere.

TABLE 16

| | Reliability evaluation of field-effect transistor ΔVon (V) | |
|---|---|---|
| | Vgs = 20 V, Vds = 0 V | Vgs = Vds = 20 V |
| Ex. 1 | +1.0 | +1.5 |
| Ex. 2 | 0 | +1.0 |
| Ex. 3 | 0 | +0.5 |
| Ex. 4 | +0.5 | +0.5 |
| Ex. 5 | +0.5 | +1.0 |
| Ex. 6 | 0 | +0.5 |
| Ex. 7 | 0 | +0.5 |
| Ex. 8 | +0.5 | +0.5 |
| Ex. 9 | 0 | +1.0 |
| Ex. 10 | +0.5 | +0.5 |
| Ex. 11 | +1.0 | +1.0 |
| Ex. 12 | +0.5 | +1.0 |
| Ex. 13 | 0 | +0.5 |
| Ex. 14 | +0.5 | +0.5 |
| Ex. 15 | +0.5 | +1.0 |
| Ex. 16 | 0 | +0.5 |
| Ex. 17 | +1.0 | +1.0 |
| Ex. 18 | +1.0 | +0.5 |
| Comp. Ex. 1 | +8.0 | +7.5 |

Example 19

<Production of Organic EL Display Device>

Figure 15:
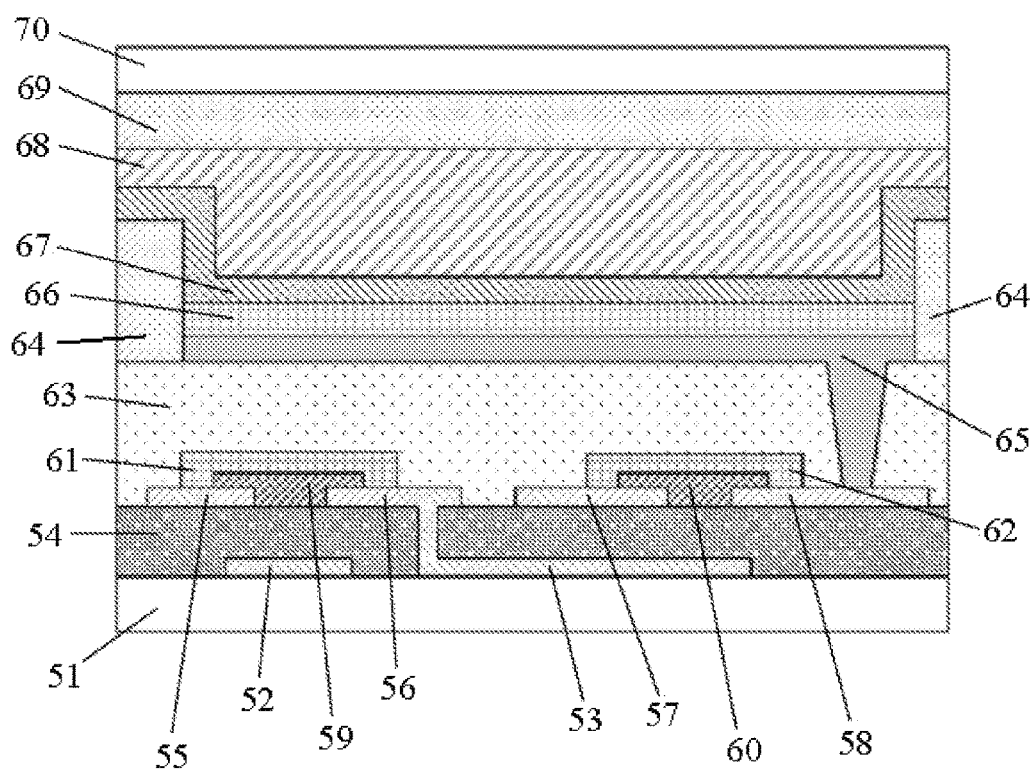
FIG. 15 is a diagram illustrating the organic EL display device produced in Example 19.

An organic EL display device as illustrated in FIG. 15 was produced.

—Formation of Gate Electrode—

First, a first gate electrode 52 and a second gate electrode 53 were formed on a glass substrate 51. Specifically, an ITO film, which was a transparent electroconductive film, was formed on the glass substrate 51 by DC sputtering so that the average film thickness of the ITO film was to be about 100 nm. Thereafter, a photoresist was applied thereon, and the applied photoresist was subjected to prebaking, light exposure by an exposure device, and developing, to thereby form a resist pattern that was identical to the pattern of the first gate electrode 52 and second gate electrode 53 to be formed. The region of the ITO film, on which the resist pattern had not been formed, was removed by RIE. Thereafter, the resist pattern was removed, to thereby form the first gate electrode 52 and the second gate electrode 53.

—Formation of Gate Insulating Layer—

Next, a gate insulating layer 54 was formed. Specifically, an $Al_2O_3$ film was formed above the first gate electrode 52, the second gate electrode 53, and the glass substrate 51 by RF sputtering so that the average film thickness of the $Al_2O_3$ film was to be about 300 nm. Thereafter, a photoresist was applied thereon, and the applied photoresist was subjected to prebaking, light exposure by an exposure device, and developing, to thereby form a resist pattern, which was identical to the pattern of the gate insulating layer 54 to be formed. The region of the $Al_2O_3$ film, on which the resist pattern had not been formed, was removed, followed by removing the resist pattern, to thereby form the gate insulating layer 54.

—Formation of Source Electrode and Drain Electrode—

Next, a first source electrode 55 and a second source electrode 57, and a first drain electrode 56 and a second drain electrode 58 were formed. Specifically, an ITO film, which was a transparent electroconductive film, was formed on the gate insulating layer 54 by DC sputtering so that the average film thickness of the ITO film was to be about 100 nm. Thereafter, a photoresist was applied on the ITO film, and the applied photoresist was subjected to prebaking, light exposure by an exposure device, and developing, to thereby form a resist pattern, which was identical to the pattern of the first source electrode 55 and the second source electrode 57, and first drain electrode 56 and the second drain electrode 58 to be formed. The region of the ITO film, on which the resist pattern had not been formed, was removed by RIE. Thereafter, the resist pattern was removed, to thereby form the first source electrode 55 and the second source electrode 57, and the first drain electrode 56 and the second drain electrode 58, each of which was formed of the ITO film.

—Formation of Oxide Semiconductor Layer—

Next, a first oxide semiconductor layer 59 and a second oxide semiconductor layer 60 were formed. Specifically, a Mg—In oxide ($In_2MgO_4$) film was formed by DC sputtering so that the average film thickness thereof was to be about 100 nm. Thereafter, a photoresist was applied on the Mg—In oxide film, and the applied photoresist was subjected to prebaking, light exposure by an exposure device, and developing, to thereby form a resist pattern, which was identical to the pattern of the first oxide semiconductor layer 59 and the second oxide semiconductor layer 60 to be formed. The region of the Mg—In oxide film, on which the resist pattern had not been formed, was removed by RIE. Thereafter, the resist pattern was removed, to thereby form the first oxide semiconductor layer 59 and second oxide semiconductor layer 60. In the manner as described, the first oxide semiconductor layer 59 was formed so that a channel was formed between the first source electrode 55 and the first drain electrode 56. Moreover, the second oxide semiconductor layer 60 was formed so that a channel was formed between the second source electrode 57 and the second drain electrode 58.

—Formation of Protective Layer—

Next, a first protective layer 61 and a second protective layer 62 were formed.

First, according to the amounts in Example 1 as depicted in Table 1, tetrabutoxy silane (T5702-100G, of Aldrich), aluminum di(s-butoxide)acetoacetic acid ester chelate (Al content: 8.4%, Alfa 89349, of Alfa Aesar), triisopropyl borate (Wako 320-41532, manufactured by Wako Chemical Ltd.), a calcium 2-ethylhexanoate mineral spirits solution (Ca content: 5%, 351-01162, manufactured by Wako Chemical Ltd.), and a strontium 2-ethylhexanoate toluene solution (Sr content: 2%, 195-09561, manufactured by Wako Pure Chemical Industries, Ltd.) were diluted with mesitylene, to thereby form a coating liquid for forming a protective layer. The metal oxide formed by the coating liquid for forming the protective layer had the same composition to that of Example 1 depicted in Table 2.

The coating liquid for forming the protective layer was applied by inkjet printing to thereby form a protective layer so that the protective layer covered the first oxide semiconductor layer 59 and the second oxide semiconductor layer 60. After drying the protective layer at 120° C. for 1 hour, baking was performed in the 02 atmosphere at 400° C. for 3 hours. As a result, a $SiO_2$-$A_2O_3$—$B_2O_3$—CaO—SrO metal oxide composite insulating film (protective layer) was obtained as the first protective layer 61 and the second protective layer 62. The average film thickness of the first protective layer 61 and the second protective layer 62 was about 30 nm.

—Formation of Interlayer Insulating Film—

Next, an interlayer insulating film 63 was formed. Specifically, a positive photosensitive organic material (SUM-IRESIN EXCEL CRC series, manufactured by Sumitomo Bakelite Co., Ltd.) was applied by spin coating, followed by subjecting to prebaking, light exposure by an exposure device, and developing, to thereby obtain the desired pattern. Thereafter, the resultant was subjected to post baking at 320° C. for 30 minutes, to thereby form the interlayer insulating film 63 having a through-hole above the second drain electrode 58. The interlayer insulating film 63 formed in this manner had the average film thickness of about 3 µm. No pealing was observed on the protective layers 61 and 62 even after the post baling of the interlayer insulating film 63.

—Formation of Partition Wall—

Next, a partition wall 64 was formed. Specifically, a surface modification of the interlayer insulating film 63 was performed by a UV ozone treatment. Thereafter, a positive photosensitive polyimide resin (DL-1000, manufactured by Toray Industries, Inc.) was applied thereon by spin coating, and the applied resin was subjected to prebaking, light exposure by an exposure device, and developing, to thereby obtain the desired pattern. Thereafter, the obtained pattern was subjected to post baking at 230° C. for 30 minutes, to thereby form a partition wall 64.

—Formation of Positive Electrode—

Next, a positive electrode 65 was formed. Specifically, a surface modification of the interlayer insulating film 63 was again performed by a UV ozone treatment, followed by applying an ITO ink containing nano particles thereon through inkjet printing, to thereby form the positive electrode 65 having the average film thickness of about 50 nm.

—Formation of Organic EL Layer—

Next, an organic El layer 66 was formed on the positive electrode 65 using a polymeric organic luminescent material by means of an inkjet device.

—Formation of Negative Electrode—

Next, a negative electrode 67 was formed. Specifically, the negative electrode 67 was formed by vacuum depositing MgAg on the organic EL layer 66 and the partition wall 64.

—Formation of Sealing Layer—

Next, a sealing layer 68 was formed. Specifically, a SiNx film was formed by PECVD so that the average film thickness thereof was to be about 2 μm, to thereby form the sealing layer 68 on the negative electrode 67.

—Bonding—

Next, the resultant was bonded to a counter substrate 70. Specifically, an adhesive layer 69 was formed on the sealing layer 68, and the counter substrate 70 composed of a glass substrate was bonded thereon. In this manner as described, a display panel of the organic EL display device having the structure illustrated in FIG. 15 was produced.

—Connection of Driving Circuit—

Next, a driving circuit was connected. Specifically, the driving circuit (not illustrated) was connected to the display panel so that an image could be displayed on the display panel. In the manner as described, an image display system of the organic EL display device was produced.

This organic EL display device is so-called "bottom emission" organic EL display device, as the field-effect transistor is all composed of transparent films, and a metal layer having high reflectance is used only for the negative electrode.

This organic EL display element exhibited high-speed operation and high reliability.

The embodiments of the present invention are, for example, as follows:

<1> A field-effect transistor, containing:
 a substrate;
 a protective layer;
 a gate insulating layer formed between the substrate and the protective layer;
 a source electrode and a drain electrode, which are formed to be in contact with the gate insulating layer;
 a semiconductor layer, which is formed at least between the source electrode and the drain electrode, and is in contact with the gate insulating layer, the source electrode, and the drain electrode; and
 a gate electrode, which is formed at an opposite side to the side where the semiconductor layer is provided, with the gate insulating layer being between the gate electrode and the semiconductor layer, and is in contact with the gate insulating layer,
 wherein the protective layer contains a metal oxide composite, which contains at least Si and alkaline earth metal.

<2> The field-effect transistor according to <1>, wherein the metal oxide composite further contains Al, or B, or a combination of Al and B.

<3> The field-effect transistor according to any of <1> or <2>, wherein the semiconductor layer is an oxide semiconductor layer.

<4> The field-effect transistor according to any one of <1> to <3>, wherein the alkaline earth metal is at least one selected from the group consisting of Mg, Ca, Sr, and Ba.

<5> A display element, containing:
 an optical control element configured to control optical output corresponding to a driving signal; and
 a driving circuit, which contains the field-effect transistor according to any one of <1> to <4>, and is configured to drive the optical control element.

<6> The display element according to <5>, wherein the optical control element contains an electroluminescent element, an electrochromic element, a liquid crystal element, an electrophoretic element, or an electrowetting element.

<7> An image display device, which displays an image corresponding to image data, the image display device containing:
 a plurality of the display elements each according to any of <5> or <6>, which are arranged in a matrix;
 a plurality of lines configured to separately apply gate voltage to each field-effect transistor in each display element; and
 a display control device configured to individually control the gate voltage of each field-effect transistor through the lines, corresponding to the image data.

<8> A system, containing:
 the image display device according to <7>; and
 an image data forming device configured to form image data based upon image information to be displayed, and to output the image data to the image display device.

REFERENCE SIGNS LIST

11 field-effect transistor
12 field-effect transistor
13 capacitor
14 field-effect transistor
15 capacitor
16 counter electrode
21 substrate
22 gate electrode
23 gate insulating layer
24 source electrode
25 drain electrode
26 oxide semiconductor layer
27 protective layer
31 substrate
32 first gate electrode
33 second gate electrode
34 gate insulating layer
35 first source electrode
36 second source electrode
37 first drain electrode
38 second drain electrode
39 first oxide semiconductor layer
40 second oxide semiconductor layer
41 first protective layer
42 second protective layer
43 interlayer insulating film
44 organic EL layer
45 negative electrode
51 glass substrate
52 first gate electrode
53 second gate electrode
54 gate insulating layer
55 first source electrode
56 first drain electrode
57 second source electrode
58 second drain electrode
59 first oxide semiconductor layer
60 second oxide semiconductor layer
61 first protective layer
62 first protective layer
63 interlayer insulating film 64 partition wall
65 positive electrode
66 organic EL layer
67 negative electrode
68 sealing layer
69 adhesive layer
70 counter substrate
81 glass substrate
82 lower electrode
83 dielectric layer
84 upper electrode
302, 302' display element
310 display
312 negative electrode
314 positive electrode
320, 320' driving circuit
340 organic EL thin film layer
342 electron transporting layer
344 light emitting layer
346 hole transporting layer
350 organic EL element
370 liquid crystal element
372 counter electrode
400 display control device
402 image data processing circuit
404 scanning line driving circuit
406 data line driving circuit

The invention claimed is:

1. A field-effect transistor, comprising:
a substrate;
a protective layer; and
a gate insulating layer, a source electrode, a drain electrode, a semiconductor layer and a gate electrode, each of said gate insulating layer, source electrode, drain electrode, semiconductor layer and gate electrode having been formed between the substrate and the protective layer;
wherein the protective layer is in contact with one or more of the semiconductor layer, the source electrode, the drain electrode and the gate electrode, and
wherein the protective layer contains an alkaline earth silicate containing at least one alkaline earth metal oxide selected from the group consisting of MgO, CaO and SrO, and a ratio of the at least one alkaline earth metal oxide, selected from the group consisting of MgO, CaO and SrO, in the alkaline earth silicate is from 5 mol % to 30.0 mol %.

2. The field-effect transistor according to claim 1, wherein the protective layer further contains Al, or B, or a combination of Al and B.

3. The field-effect transistor according to claim 1, wherein the semiconductor layer is an oxide semiconductor layer.

4. The field-effect transistor according to claim 1, wherein the semiconductor layer is an In—Ga—Zn—O oxide semiconductor layer or an In—Mg—O oxide semiconductor layer.

5. A display element, comprising:
an optical control element configured to control optical output corresponding to a driving signal; and
a driving circuit, which contains the field-effect transistor according to claim 1, and is configured to drive the optical control element,
wherein the optical control element contains an electroluminescent element, an electrochromic element, a liquid crystal element, an electrophoretic element, or an electrowetting element.

6. An image display device, which displays an image corresponding to image data, the image display device comprising:
a plurality of the display elements each according to claim 5, which are arranged in a matrix;
a plurality of lines configured to separately apply gate voltage to each field-effect transistor in each display element; and
a display control device configured to individually control the gate voltage of each field-effect transistor through the lines, corresponding to the image data.

7. A system, comprising:
the image display device according to claim 6; and
an image data forming device configured to form image data based upon image information to be displayed, and to output the image data to the image display device.

8. A field-effect transistor, comprising:
a substrate;
a protective layer; and
a gate insulating layer, a source electrode, a drain electrode, a semiconductor layer and a gate electrode, each of said gate insulating layer, source electrode, drain electrode, semiconductor layer and gate electrode having been formed between the substrate and the protective layer;
wherein the protective layer is in contact with one or more of the semiconductor layer, the source electrode, the drain electrode and the gate electrode,
wherein the protective layer contains an alkaline earth silicate containing at least one alkaline earth metal oxide selected from the group consisting of MgO, CaO and SrO, and a ratio of the at least one alkaline earth metal oxide, selected from the group consisting of MgO, CaO and SrO, in the alkaline earth silicate is less than 5 mol % and greater than 0.0 mol %, and
wherein the protective layer further contains Al, or B, or a combination of Al and B.

9. The field-effect transistor according to claim 8, wherein the semiconductor layer is an oxide semiconductor layer.

10. A display element, comprising:
an optical control element configured to control optical output corresponding to a driving signal; and
a driving circuit, which contains the field-effect transistor according to claim 8, and is configured to drive the optical control element,
wherein the optical control element contains an electroluminescent element, an electrochromic element, a liquid crystal element, an electrophoretic element, or an electrowetting element.

11. An image display device, which displays an image corresponding to image data, the image display device comprising:
plural display elements which are arranged in a matrix, each of the plural display elements being configured same as the display element according to claim 10;
a plurality of lines configured to separately apply gate voltage to at least one corresponding field-effect transistor in the display elements; and
a display control device configured to individually control the gate voltage of field-effect transistors of the plural display elements, through the lines, corresponding to the image data.

* * * * *